(12) United States Patent
Chou

(10) Patent No.: US 11,488,959 B2
(45) Date of Patent: Nov. 1, 2022

(54) GATE-ALL-AROUND SEMICONDUCTOR DEVICE WITH DIELECTRIC-ALL-AROUND CAPACITOR AND METHOD FOR FABRICATING THE SAME

(71) Applicant: NANYA TECHNOLOGY CORPORATION, New Taipei (TW)

(72) Inventor: Liang-Pin Chou, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 37 days.

(21) Appl. No.: 17/136,812

(22) Filed: Dec. 29, 2020

(65) Prior Publication Data
US 2022/0208769 A1    Jun. 30, 2022

(51) Int. Cl.
*H01L 27/108* (2006.01)
*H01L 49/02* (2006.01)
(Continued)

(52) U.S. Cl.
CPC .. *H01L 27/10814* (2013.01); *H01L 21/02236* (2013.01); *H01L 21/02603* (2013.01);
(Continued)

(58) Field of Classification Search
CPC ......... H01L 27/10814; H01L 21/02236; H01L 21/02603; H01L 27/10855;
(Continued)

(56) References Cited

U.S. PATENT DOCUMENTS

2018/0083046 A1* 3/2018 Cheng .................... H01L 28/82
2018/0175167 A1* 6/2018 Reboh ................. H01L 29/7848
(Continued)

FOREIGN PATENT DOCUMENTS

CN        109285838 A    1/2019
CN        109461738 A    3/2019
(Continued)

*Primary Examiner* — Tong-Ho Kim
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first stack structure positioned on a first substrate, a first impurity region and a second impurity region respectively positioned on opposing sides of the first stack structure and operatively associated with the first stack structure, a second stack structure positioned above the first stack structure with a middle insulation layer interposed therebetween, and a third impurity region positioned on one side of the second stack structure and electrically coupled to the second impurity region. The first stack structure includes a plurality of first semiconductor layers and a plurality of gate assemblies alternatively arranged. The plurality of gate assemblies includes a gate dielectric and a gate electrode. The second stack structure includes a plurality of second semiconductor layers and a plurality of capacitor sub-units alternatively arranged. The plurality of capacitor sub-units including a capacitor dielectric and a capacitor electrode.

17 Claims, 37 Drawing Sheets

(51) Int. Cl.
  *H01L 29/06* (2006.01)
  *H01L 29/423* (2006.01)
  *H01L 29/786* (2006.01)
  *H01L 21/02* (2006.01)
  *H01L 29/66* (2006.01)

(52) U.S. Cl.
  CPC .. *H01L 27/10855* (2013.01); *H01L 27/10873* (2013.01); *H01L 28/60* (2013.01); *H01L 29/0673* (2013.01); *H01L 29/42392* (2013.01); *H01L 29/66545* (2013.01); *H01L 29/66742* (2013.01); *H01L 29/78696* (2013.01)

(58) Field of Classification Search
  CPC .............. H01L 27/10873; H01L 28/60; H01L 29/0673; H01L 29/42392; H01L 29/66545; H01L 29/66742; H01L 29/78696
  USPC ........................................................ 257/296
  See application file for complete search history.

(56) References Cited

U.S. PATENT DOCUMENTS

2020/0098757 A1\* 3/2020 Rachmady ........ H01L 29/66742
2021/0375883 A1\* 12/2021 Hsu ...................... G11C 11/417
2022/0013523 A1\* 1/2022 Cheng ............... H01L 29/42392

FOREIGN PATENT DOCUMENTS

TW  201332110 A  8/2013
TW  201941426 A  10/2019

\* cited by examiner

GATE-ALL-AROUND SEMICONDUCTOR DEVICE WITH DIELECTRIC-ALL-AROUND CAPACITOR AND METHOD FOR FABRICATING THE SAME

TECHNICAL FIELD

The present disclosure relates to a semiconductor device and a method for fabricating the semiconductor device, and more particularly, to a gate-all-around semiconductor device with a dielectric-all-around capacitor and the method for fabricating the gate-all-around semiconductor device with the dielectric-all-around capacitor.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first stack structure positioned on a first substrate, a first impurity region and a second impurity region respectively positioned on opposing sides of the first stack structure and operatively associated with the first stack structure, a second stack structure positioned above the first stack structure with a middle insulation layer interposed therebetween, and a third impurity region positioned on one side of the second stack structure and electrically coupled to the second impurity region. The first stack structure includes a plurality of first semiconductor layers and a plurality of gate assemblies alternatively arranged. The plurality of gate assemblies includes a gate dielectric and a gate electrode. The second stack structure includes a plurality of second semiconductor layers and a plurality of capacitor sub-units alternatively arranged. The plurality of capacitor sub-units including a capacitor dielectric and a capacitor electrode.

In some embodiments, the semiconductor device includes a buried bit line positioned in the first substrate and electrically coupled to the first impurity region.

In some embodiments, the buried bit line is horizontally distal from the first stack structure.

In some embodiments, the semiconductor device includes a plurality of first internal spacers positioned between the first impurity region and the plurality of gate assemblies and between the second impurity region and the plurality of gate assemblies.

In some embodiments, the semiconductor device includes gate spacers positioned on opposing sides of a topmost one of the plurality of gate assemblies.

In some embodiments, the gate spacers and the plurality of first internal spacers are formed of a same material.

In some embodiments, the semiconductor device includes a plurality of second internal spacers positioned between the third impurity region and the plurality of capacitor sub-units.

In some embodiments, the semiconductor device includes a fourth impurity region positioned opposite to the third impurity region.

In some embodiments, the second impurity region and the third impurity region are electrically connected by a first conductive plug.

In some embodiments, the semiconductor device includes a first conductive pad positioned underneath the third impurity region and a first conductive plug positioned underneath the first conductive pad and on the second impurity region. The second impurity region and the third impurity region are electrically coupled by the first conductive pad and the first conductive plug.

In some embodiments, a lowermost one of the plurality of first semiconductor layers directly contacts a top surface of the first substrate.

In some embodiments, a lowermost one of the plurality of gate assemblies directly contacts a top surface of the first substrate.

In some embodiments, the semiconductor device includes a buried insulation layer positioned in the first substrate, wherein the first stack structure is positioned on the buried insulation layer.

In some embodiments, the semiconductor device includes a buffer layer positioned between the first substrate and the first stack structure.

In some embodiments, a thickness of the second stack structure is greater than a thickness of the first stack structure.

In some embodiments, a lowermost one of the plurality of second semiconductor layers directly contacts a top surface of the middle insulation layer.

In some embodiments, a lowermost one of the plurality of capacitor sub-units directly contacts a top surface of the middle insulation layer.

Another aspect of the present disclosure provides a method for fabricating a semiconductor device including forming a first stack structure on a first substrate, forming a first impurity region and a second impurity region respectively on opposing sides of the first stack structure, forming a middle insulation layer on the first stack structure, forming a first conductive plug along the middle insulation layer and electrically connected to the second impurity region, forming a second stack structure on the middle insulation layer, and forming a third impurity region on one side of the second stack structure and electrically connected to the first conductive plug. The first stack structure includes a plurality of first semiconductor layers and a plurality of gate assemblies alternatively arranged. The plurality of gate assemblies includes a gate dielectric and a gate electrode. The second stack structure includes a plurality of second semiconductor layers and a plurality of capacitor sub-units alternatively arranged. The plurality of capacitor sub-units includes a capacitor dielectric and a capacitor electrode.

In some embodiments, the step of forming the first stack structure on the first substrate includes forming a first vertical stack on the first substrate including alternatively forming a plurality of fourth semiconductor layers and the plurality of first semiconductor layers, forming a first dummy gate on the first vertical stack, forming first trenches on opposing sides of the first vertical stack to expose side portions of the plurality of first semiconductor layers and the plurality of third semiconductor layers, oxidizing the side portions of the plurality of first semiconductor layers and the plurality of third semiconductor layers to form first side-portion oxides on opposing sides of the plurality of first semiconductor layers and third side-portion oxides on opposing sides of the plurality of third semiconductor layers, removing the first side-portion oxides, forming a first impurity region and a second impurity region in the first trenches, forming a layer of first insulation material to cover the first dummy gate, the first impurity region, the second impurity region, and the first vertical stack, removing a portion of the layer of first insulation material to expose the first dummy gate, removing the first dummy gate and the plurality of third semiconductor layers to form a plurality of first spaces, and sequentially forming the gate dielectric and the gate electrode to fill the plurality of first spaces. The gate dielectric and gate electrode together configure the plurality of gate assemblies. The plurality of first semiconductor layers and the plurality of gate assemblies together configure the first stack structure.

In some embodiments, the step of forming the second stack structure on the middle insulation layer includes forming a second vertical stack on a second substrate including alternatively forming a plurality of fourth semiconductor layers and the plurality of second semiconductor layers, forming a second dummy gate on the second vertical stack, forming second trenches on opposing sides of the second vertical stack to expose side portions of the plurality of second semiconductor layers and the plurality of fourth semiconductor layers, oxidizing the side portions of the plurality of second semiconductor layers and the plurality of fourth semiconductor layers to form second side-portion oxides on opposing sides of the plurality of second semiconductor layers and fourth side-portion oxides on opposing sides of the plurality of fourth semiconductor layers, removing the second side-portion oxides, removing the second dummy gate and the plurality of fourth semiconductor layers to form a plurality of second spaces, sequentially forming the capacitor dielectric and the capacitor electrode to fill the plurality of second spaces, inversely bonding the second stack structure onto the middle insulation layer, and removing the second substrate. The capacitor dielectric and capacitor electrode together configure the plurality of capacitor sub-units. The plurality of second semiconductor layers and the plurality of capacitor sub-units together configure the second stack structure.

Due to the design of the semiconductor device of the present disclosure, the contact surface between the capacitor electrode and the capacitor dielectric may be improved. Accordingly, the capacitor configured from the capacitor dielectric and the capacitor electrode may have improved electrical characteristics. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
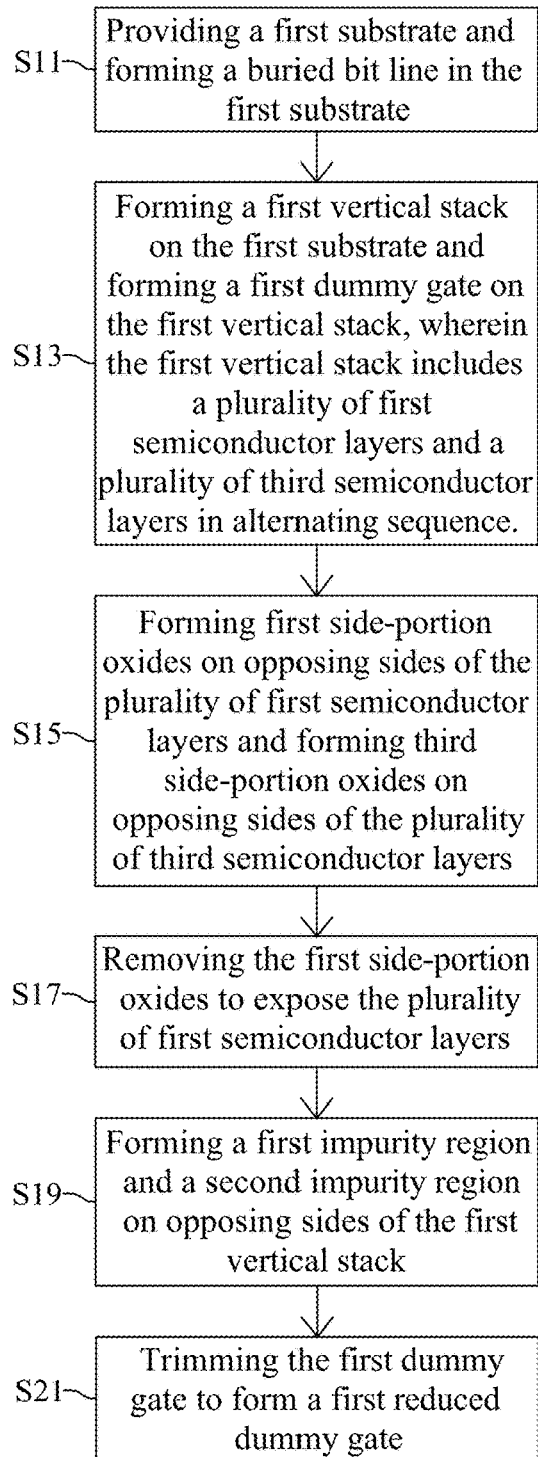
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

FIG. 1 illustrates, in a flowchart diagram form, a method 10 for fabricating a semiconductor device 1A in accordance with one embodiment of the present disclosure. FIGS. 2 to 24 illustrate, in schematic cross-sectional view diagrams, a flow for fabricating a semiconductor device 1A in accordance with one embodiment of the present disclosure.

Figure 2:
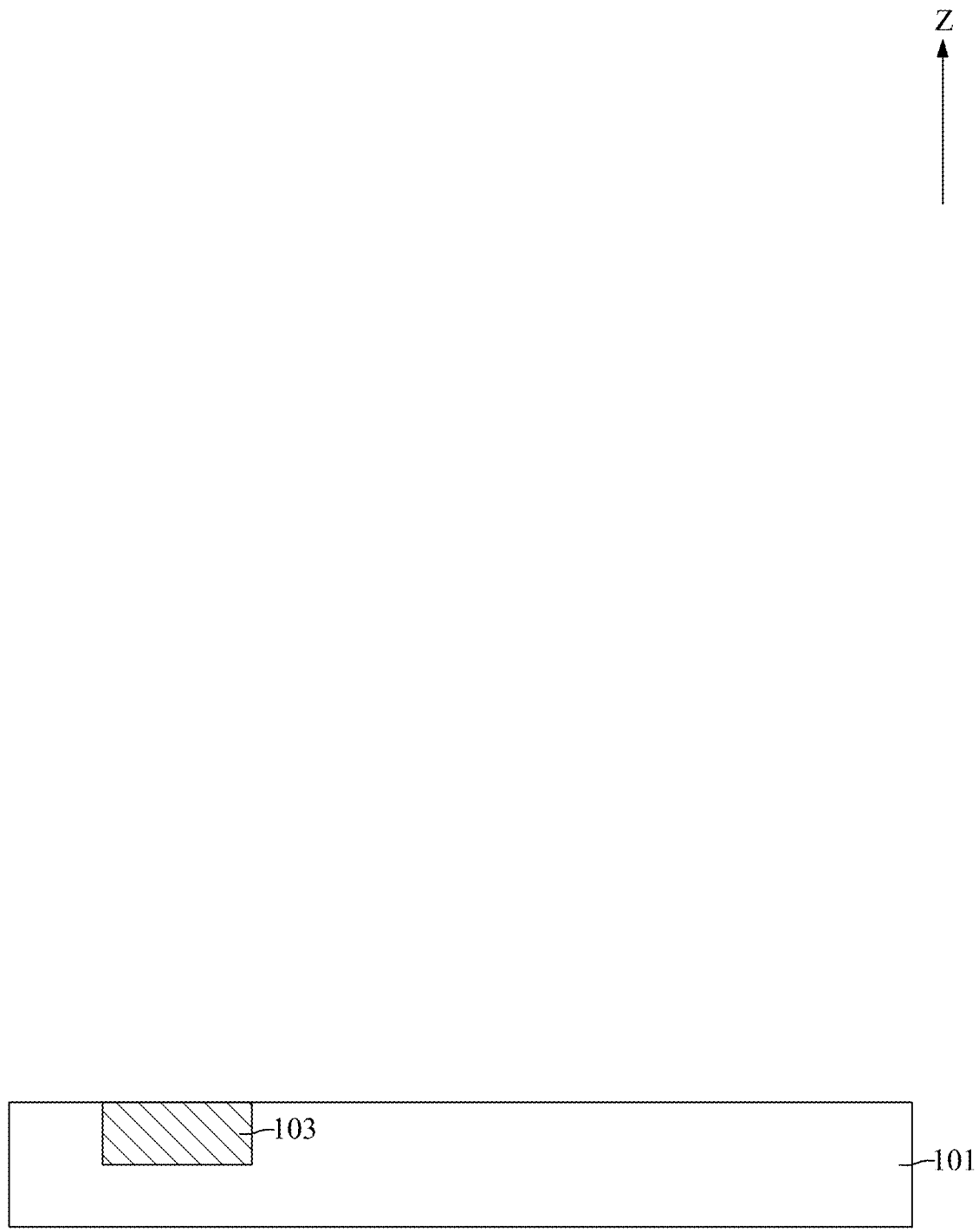
FIGS. 2 to 24 illustrate, in schematic cross-sectional view diagrams, a flow for fabricating a semiconductor device in accordance with one embodiment of the present disclosure.

With reference to FIGS. 1 and 2, at step S11, a first substrate 101 may be provided and a buried bit line 103 may be formed in the first substrate 101.

With reference to FIG. 2, the first substrate 101 may be a bulk semiconductor substrate, a multi-layered or gradient substrate, or the like. The first substrate 101 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, or GaInAsP; or a combination thereof. The first substrate 101 may be doped or undoped.

With reference to FIG. 2, the top surface of the buried bit line 103 may be substantially coplanar with the top surface of the first substrate 101. In some embodiments, the buried bit line 103 may be an impurity region. A photoresist layer may be formed over the first substrate 101. The photoresist layer may be patterned to expose the area where the buried bit line 103 to be formed. The photoresist layer may be formed by using a spin-on technique and may be patterned using acceptable photolithography techniques. Once the photoresist layer is patterned, an n-type impurity or a p-type impurity implant process may be performed, and the photoresist layer may act as a mask to substantially prevent impurities from being implanted into the covered area. After the implant process, the photoresist layer may be removed, such as by an acceptable ashing process.

The n-type impurity implant process may add impurities that contribute free electrons to an intrinsic semiconductor. In a silicon-containing substrate, examples of n-type dopants, i.e., impurities, include but are not limited to antimony, arsenic, or phosphorous. The p-type impurity implant process may add impurities to an intrinsic semiconductor that creates deficiencies of valence electrons. In a silicon-containing substrate, examples of p-type dopants, i.e., impurities include but are not limited to boron, aluminum, gallium, or indium. The dopant concentration of the buried bit line 103 may be between about 1E17 atoms/cm^3 and between about 1E18 atoms/cm^3.

In some embodiments, the buried bit line 103 may be formed of, for example, polycrystalline silicon, doped polycrystalline silicon, polycrystalline silicon germanium, doped polycrystalline silicon germanium, or a metallic material (e.g., titanium, tantalum, tungsten, copper, or aluminum).

Figure 3:
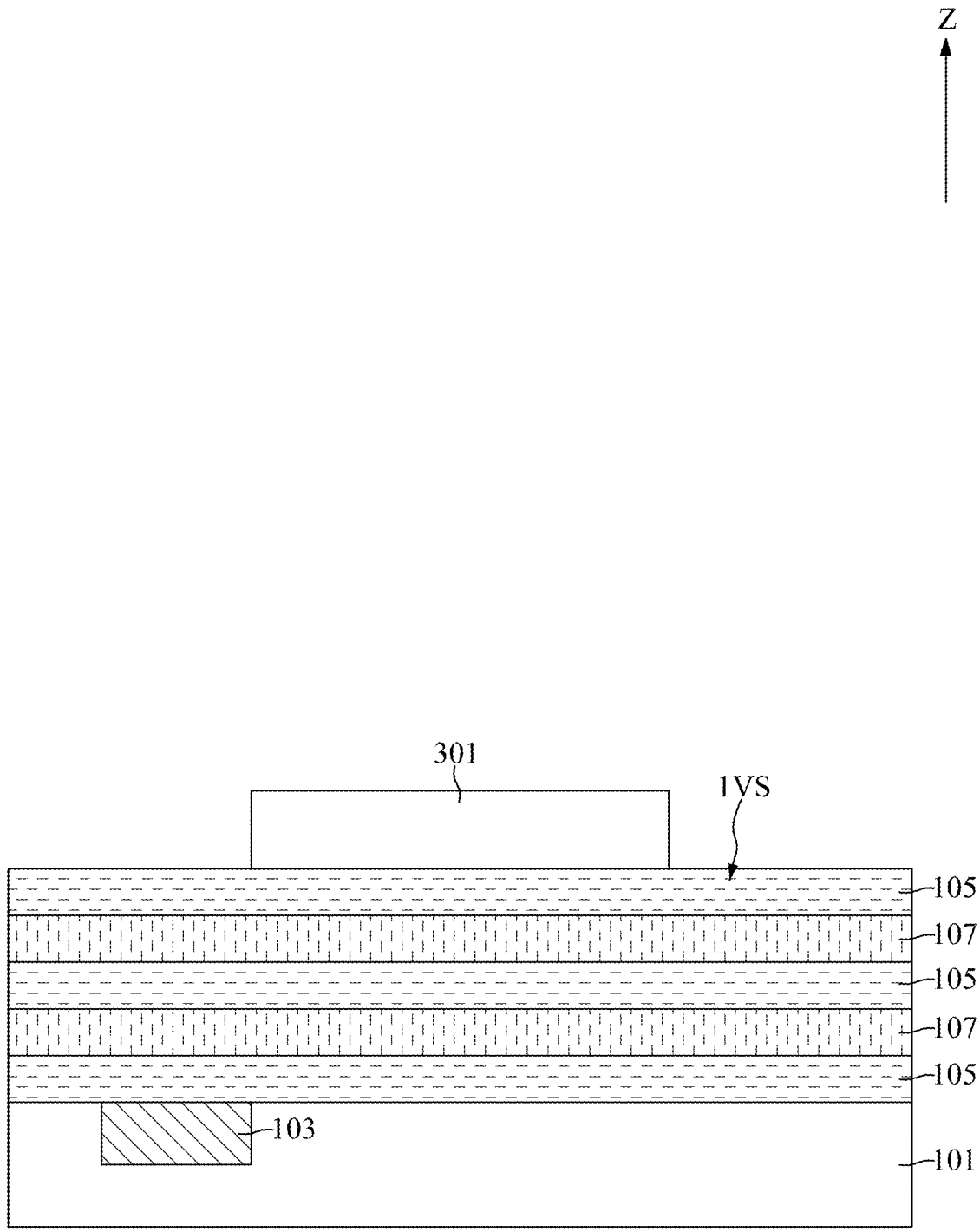

With reference to FIGS. 1 and 3, at step S13, a first vertical stack 1VS may be formed on the first substrate 101 and a first dummy gate 301 may be formed on the first vertical stack 1VS. The first vertical stack 1VS may include a plurality of third semiconductor layers 105 and a plurality of first semiconductor layers 107 formed in alternating sequence.

With reference to FIG. 3, the plurality of third semiconductor layers 105 and the plurality of first semiconductor layers 107 may be epitaxially grown in alternating sequence to obtain the first vertical stack 1VS having the desired number of layers. For example, the plurality of third semiconductor layers 105 and the plurality of first semiconductor layers 107 may be formed by metal-organic chemical vapor deposition, molecular beam epitaxy, liquid phase epitaxy, vapor phase epitaxy, ultra-high-vacuum chemical vapor deposition, the like, or a combination thereof. In the present embodiments, the lowermost one of the plurality of third semiconductor layers 105 may directly contact the top surface of the first substrate 101. The lowermost one of the plurality of first semiconductor layers 107 may be formed above the top surface of the first substrate 101.

In some embodiments, each of the plurality of third semiconductor layers 105 and each of the plurality of first semiconductor layers 107 may include a crystalline material. The plurality of third semiconductor layers 105 and the plurality of first semiconductor layers 107 may have thicknesses less than a critical thickness. In some embodiments, the plurality of third semiconductor layers 105 may have thicknesses in the range between about 6 nm and about 20 nm. The plurality of first semiconductor layers 107 may have thicknesses in the range between about 4 nm and about 10 nm.

In some embodiments, each of the plurality of third semiconductor layers 105 and each of the plurality of first semiconductor layers 107 may be a group IV material, such as Si, Ge, SiGe, SiGeSn, or the like, or a group III-group V compound material, such as GaAs, GaP, GaAsP, AlInAs, AlGaAs, GaInAs, InAs, GaInP, InP, InSb, GaInAsP, or the like. In some embodiments, the plurality of third semiconductor layers 105 and the plurality of first semiconductor layers 107 may be formed of different materials. The difference in materials may allow for the different strains for the plurality of third semiconductor layers 105 and the plurality of first semiconductor layers 107. For example, each of the plurality of third semiconductor layers 105 is a layer of $Si_{0.50}Ge_{0.50}$ and each of the plurality of first semiconductor layers 107 is a layer of Si. The plurality of third semiconductor layers 105 may have natural lattice constant larger than that of the plurality of first semiconductor layers 107. Hence, the plurality of third semiconductor layers 105 may be compressively strained and the plurality of first semiconductor layers 107 may be tensilely strained.

With reference to FIG. 3, the first dummy gate 301 may have sidewalls extending vertically from the top surface of the first vertical stack 1VS. The first dummy gate 301 may be vertically non-overlapped with the buried bit line 103. The first dummy gate 301 may be formed of, for example, amorphous silicon, polycrystalline silicon, silicon oxynitride, silicon nitride oxide, silicon borocarbonitride, silicon oxycarbonitride, or silicon oxycarbide. The first dummy gate 301 may consist a single layer or multiple layers of aforementioned material. The first dummy gate 301 may be formed by any suitable method, including depositing a layer of aforementioned material using chemical vapor deposition and removing unwanted material using a patterning technique such as photolithography in conjunction with reactive ion etching or plasma etching.

Figure 4:
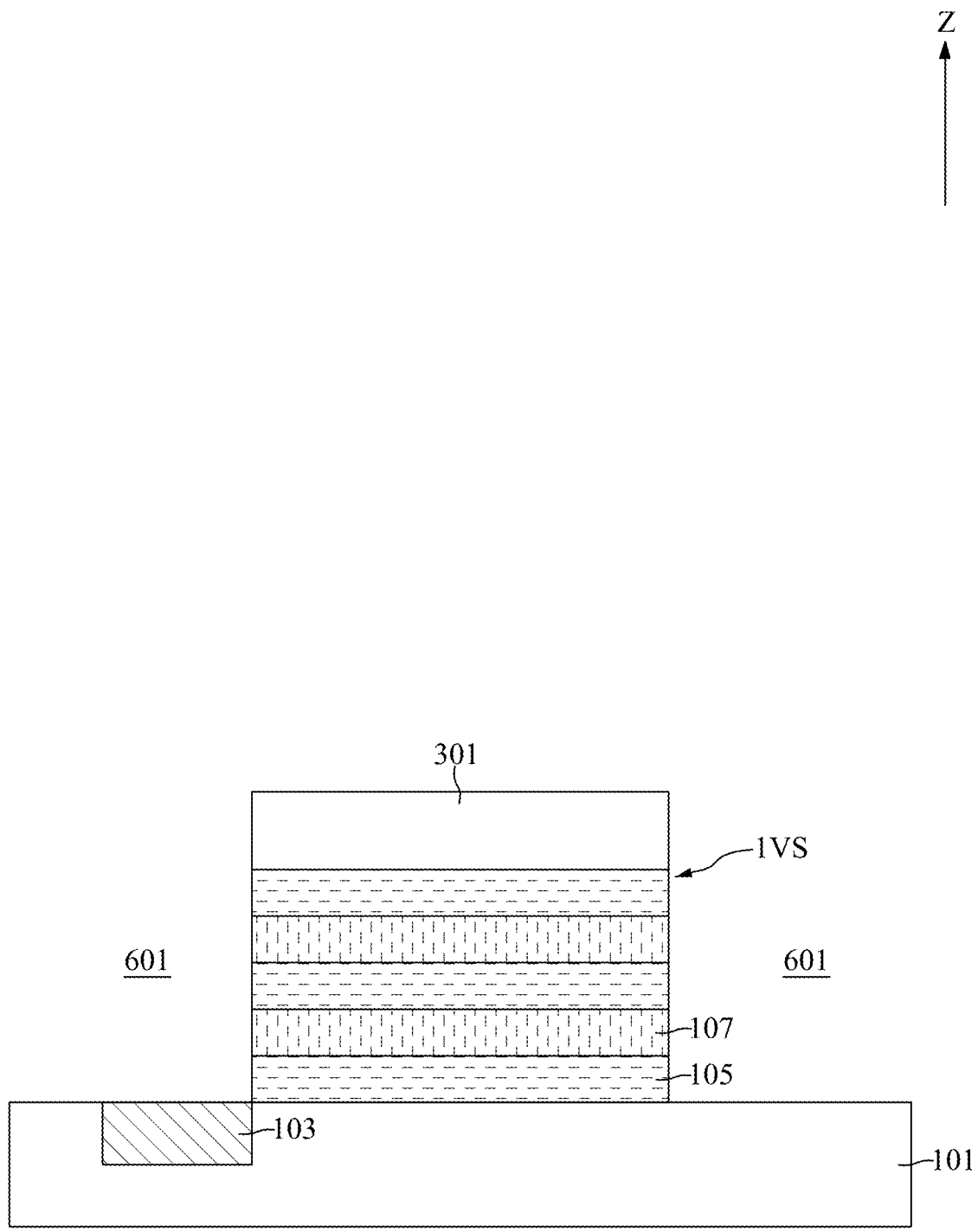
Figure 5:
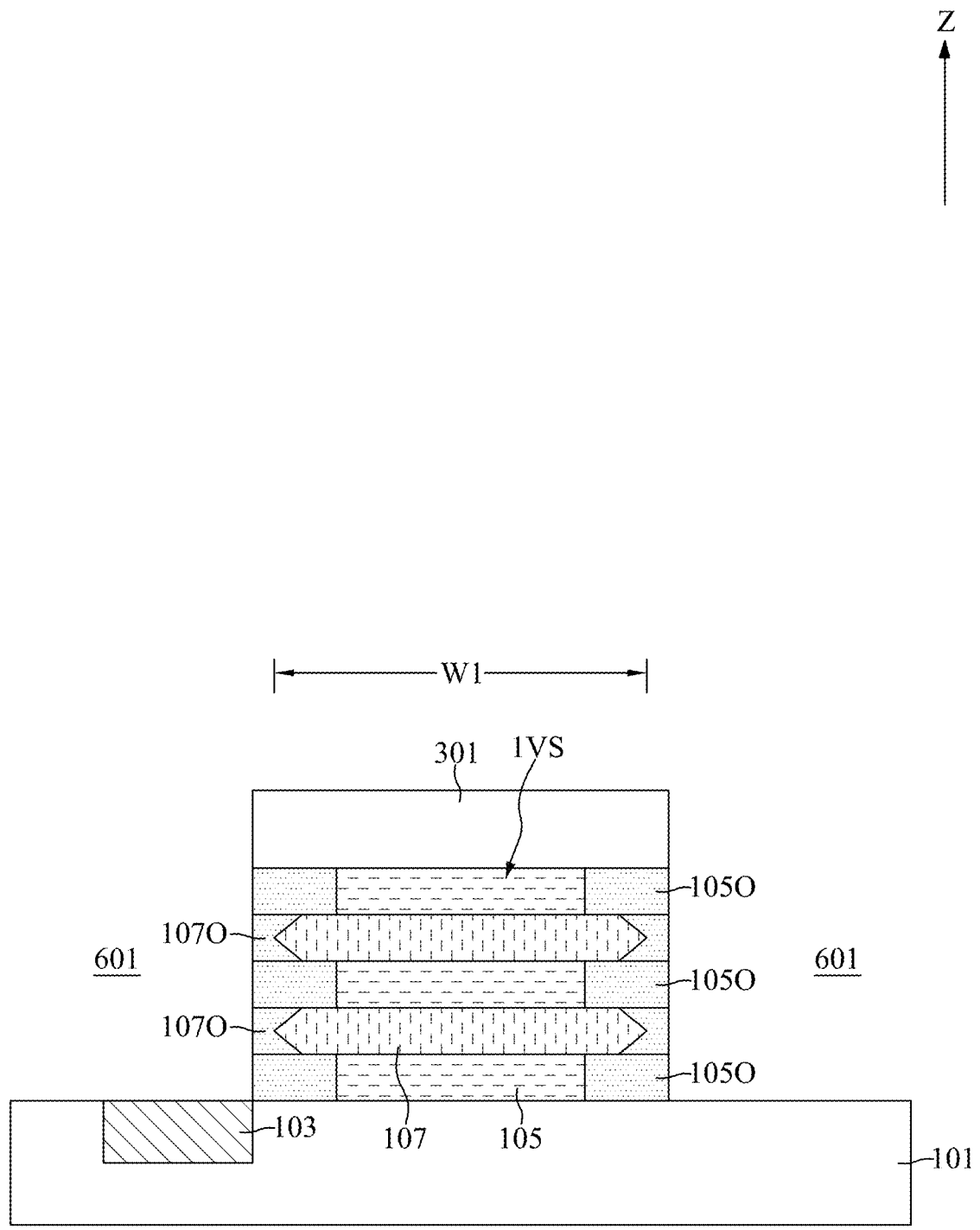

With reference to FIGS. 1, 4, and 5, at step S15, third side-portion oxides 105O may be formed on opposing sides of the plurality of third semiconductor layers 105 and first side-portion oxides 107O may be formed on opposing sides of the plurality of first semiconductor layers 107.

With reference to FIG. 4, an etch process may be performed to the intermediate semiconductor device illustrated in FIG. 3 to form first trenches 601 on opposing sides of the first vertical stack 1VS. The first dummy gate 301 may serve as a protective mask during the etch process. The etch process may be, for example, a reactive ion etch, a neutral beam etch, the like, or a combination thereof. The etch process may be anisotropic. After the etch process, side portions of the plurality of third semiconductor layers 105 and side portions of the plurality of first semiconductor layers 107 may be exposed through the first trenches 601.

With reference to FIG. 5, a low-temperature oxidation process may be conducted at a process temperature less than 700° C. to oxidize the exposed side portions of the plurality of third semiconductor layers 105 and the plurality of first semiconductor layers 107. In the present embodiment, a wet oxidation conducted at 630° C. is employed. The plurality of third semiconductor layers 105 formed of $Si_{0.50}Ge_{0.50}$ may oxidize at least ten times faster than the plurality of first semiconductor layers 107 formed of Si under such condition. As a result, the third side-portion oxides 105O formed during the low-temperature oxidation process may be relatively thicker than the first side-portion oxides 107O formed during the low-temperature oxidation process.

In some embodiments, the width W1 of the plurality of first semiconductor layers 107 after the low-temperature oxidation process may be between about 10 nm and about 100 nm. In some embodiments, the sides of the plurality of first semiconductor layers 107 may be rounded as a result of the low-temperature oxidation process.

Figure 6:
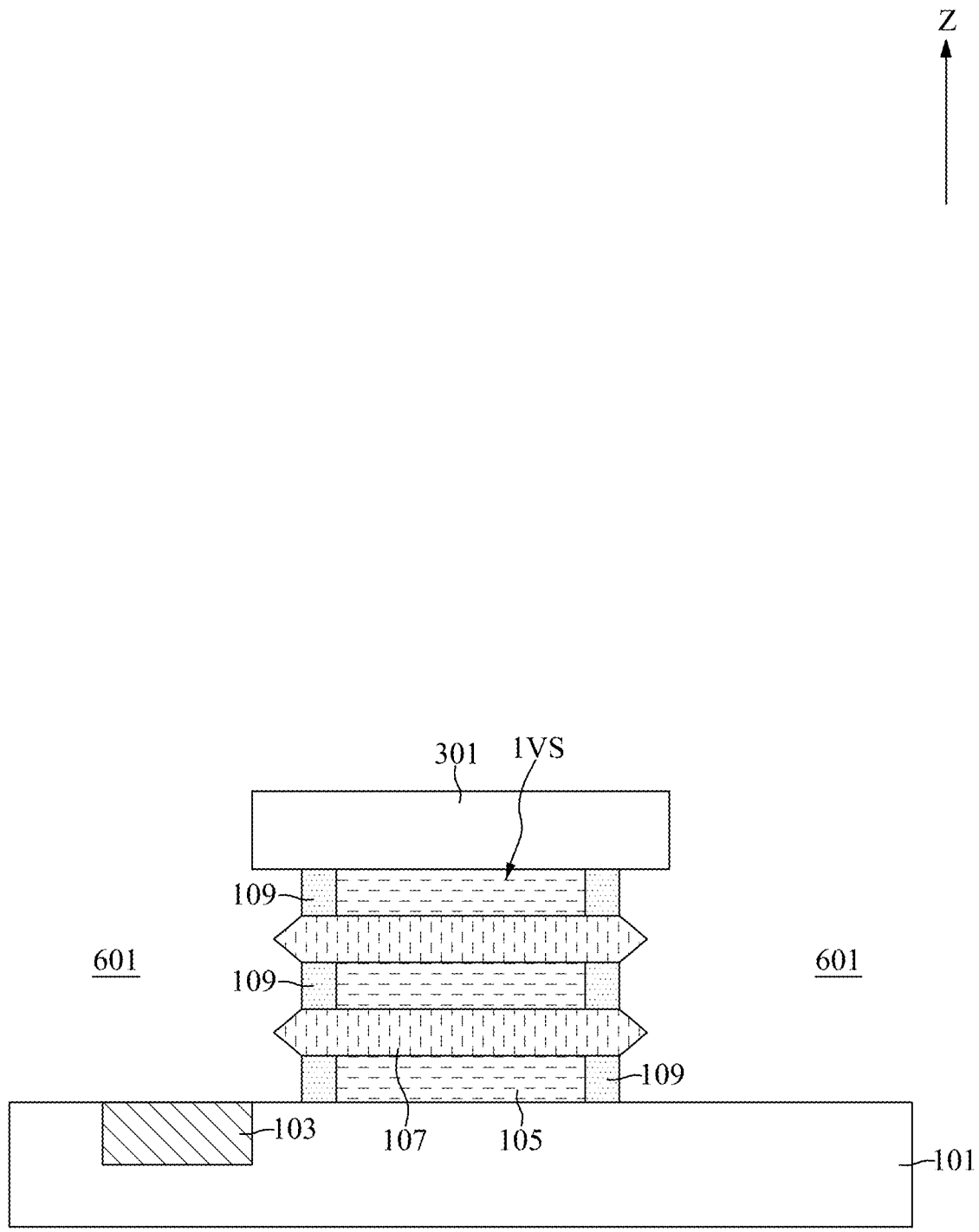

With reference to FIGS. 1 and 6, at step S17, the first side-portion oxides 107O may be removed to expose the plurality of first semiconductor layers 107.

With reference to FIG. 6, an oxide etch process may be performed to remove the first side-portion oxides 107O. The oxide etch process may be a plasma-assisted dry etch process that involves simultaneous exposure of a substrate to hydrogen, $NF_3$ and $NH_3$ plasma by-products or a wet etch using a solution containing hydrofluoric acid. The exposed plurality of first semiconductor layers 107 may be served as seed to epitaxially grow impurities region as will be illustrated later. It should be noted that portions of the third side-portion oxides 105O may also be removed. However, due to the third side-portion oxides 105O are thicker than the first side-portion oxides 107O, the third side-portion oxides 105O may still cover the plurality of third semiconductor layers 105 after the removal of the first side-portion oxides 107O. The remained third side-portion oxides 105O may be referred to as a plurality of first internal spacers 109.

Figure 7:
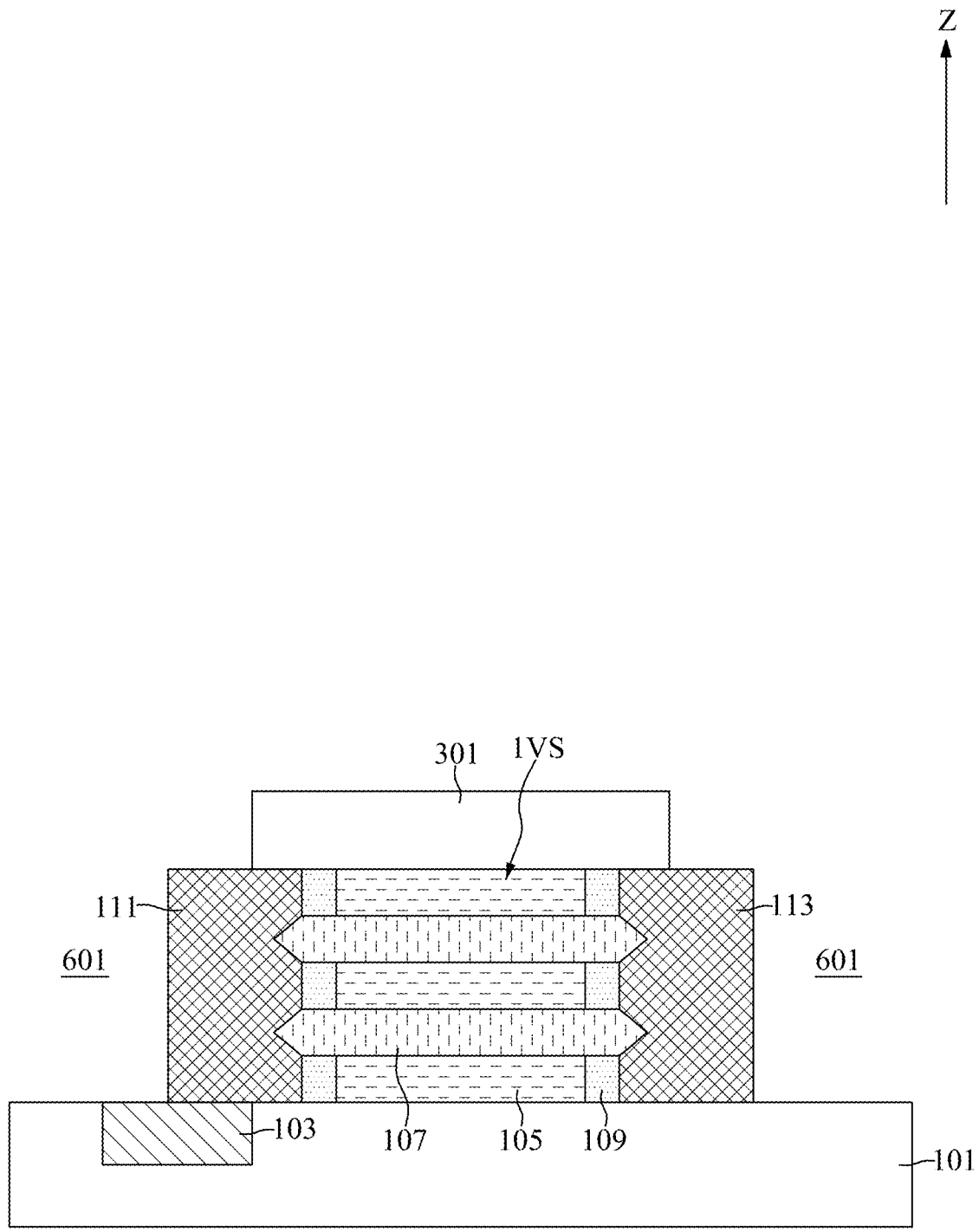

With reference to FIGS. 1 and 7, at step S19, a first impurity region 111 and a second impurity region 113 may be formed on the opposing sides of the first vertical stack 1VS.

With reference to FIG. 7, the first impurity region 111 and second impurity region 113 may be formed in the first trenches 601 and on the first substrate 101. The first impurity region 111 may be electrically connected to the buried bit line 103. The second impurity region 113 may be electrically coupled to the first impurity region 111 through the plurality of first semiconductor layers 107. The first impurity region 111 and the second impurity region 113 may be formed by an epitaxial growth process such as rapid thermal chemical vapor deposition, low-energy plasma deposition, ultra-high vacuum chemical vapor deposition, atmospheric pressure chemical vapor deposition, or molecular beam epitaxy. The epitaxial growth process may be selective to the material of the first dummy gate 301, so the epitaxial material does not grow on the first dummy gate 301.

In some embodiments, the epitaxial material for a n-type device may include Si, SiC, SiCP, SiGeP, SiP, SiGeSnP, or the like, and the epitaxial material for a p-type device may include SiGe, SiGeB, Ge, GeB, GeSn, GeSnB, a boron-doped III-V compound material, or the like.

In some embodiments, dopants may be incorporated in-situ using appropriate precursors. The dopant concentration of the first impurity region 111 and the second impurity region 113 may be between about $1E19$ atoms/$cm^3$ and about $1E21$ atoms/$cm^3$. It should be noted that the term "in-situ" means that the dopant that dictates the conductivity type of a doped layer is introduced during the process step, for example epitaxial deposition, that forms the doped layer. The term "conductivity type" denotes a dopant region being p-type or n-type.

In some embodiments, an epitaxy pre-clean process may be employed to remove the thin layers of oxide material at the sides of the plurality of first semiconductor layers 107. The sides of the plurality of third semiconductor layers 105 may still covered by the third side-portion oxides 105O during the epitaxy pre-clean process. The epitaxy pre-clean process may be a plasma-assisted dry etch process that involves simultaneous exposure of a substrate to hydrogen, $NF_3$ and $NH_3$ plasma by-products or a wet etch using a solution containing hydrofluoric acid.

In some embodiments, a layer of conductive material such as titanium, nickel, platinum, tantalum, or cobalt may be formed to cover the first substrate 101, the first impurity region 111, the second impurity region 113, and the first dummy gate 301. A thermal treatment may be subsequently performed. During the thermal treatment, metal atoms of the layer of conductive material may react chemically with silicon atoms of first impurity region 111 and the second impurity region 113 to form a silicide layer (not shown). The silicide layer may include titanium silicide, nickel silicide, nickel platinum silicide, tantalum silicide, or cobalt silicide. The thickness of the silicide layer is between about 2 nm and about 20 nm. The thermal treatment may be a dynamic surface annealing process. After the thermal treatment, a cleaning process may be performed to remove the unreacted conductive material. The cleaning process may use etchant such as hydrogen peroxide and an SC-1 solution. The silicide layer may reduce the contact resistance of the first impurity region 111 and the second impurity region 113.

Figure 8:
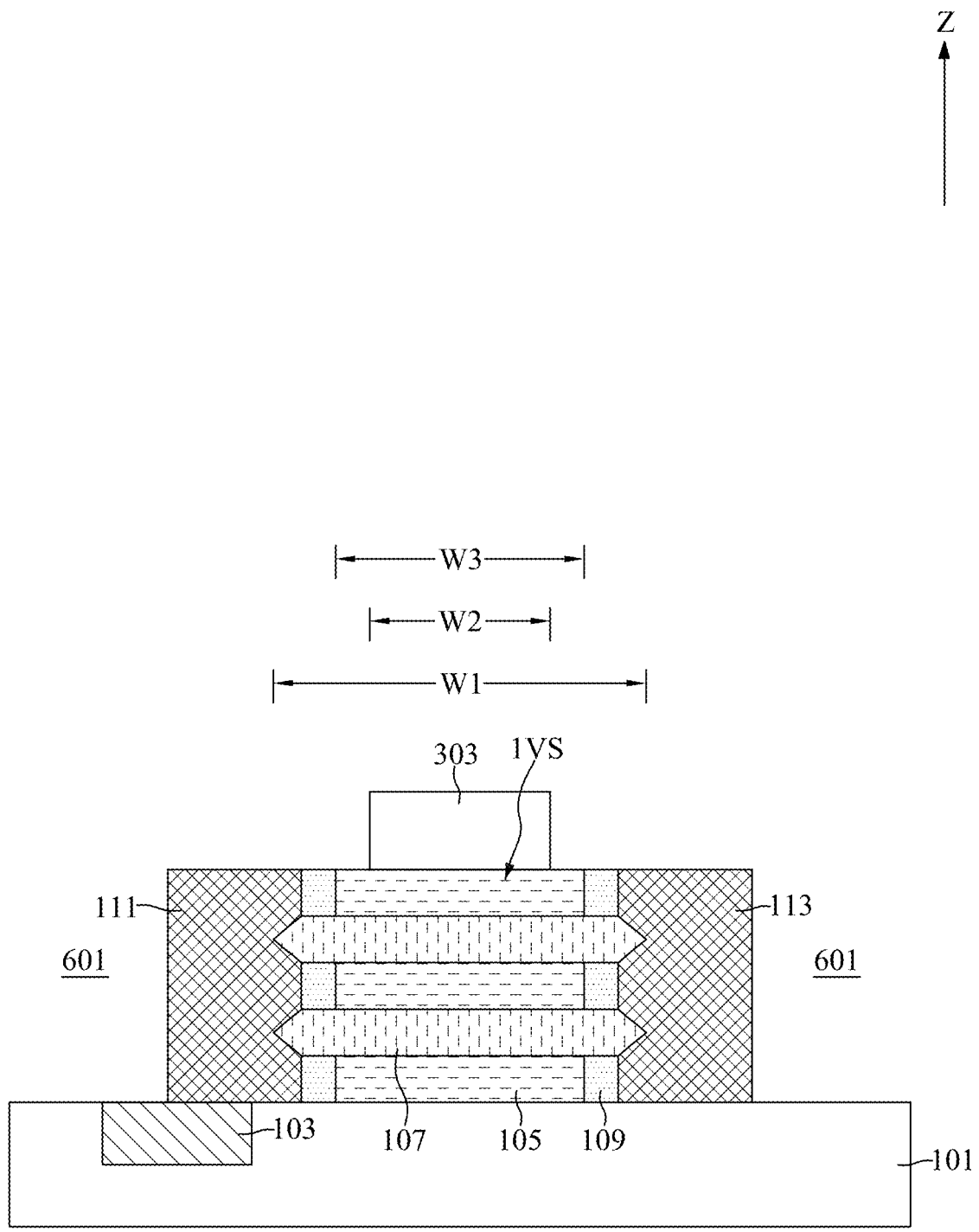

With reference to FIGS. 1 and 8, at step S21, the first dummy gate 301 may be trimmed to form a first reduced dummy gate 303.

With reference to FIG. 8, a directional etch process may be employed to reduce the width of the first dummy gate 301 to form the first reduced dummy gate 303. The width W2 of the first reduced dummy gate 303 may be less than the width W1 of the plurality of first semiconductor layers 107 and the width W3 of the plurality of third semiconductor layers 105. The first reduced dummy gate 303 may be vertically non-overlapped with the plurality of first internal spacers 109.

The directional etch process may be an atomic layer etch process using sequential self-limiting reactions to reduce the dimensions of a substrate (e.g., the first dummy gate 301). The atomic layer etch process may apply adsorption and desorption processes alternately in a cyclic process. $CH_3F$/Ar plasma without RF bias may be applied as an adsorption process to deposit a hydrofluorocarbon layer on the targeted surfaces. Ar plasma with RF bias may be applied as a desorption process to remove the target materials with the hydrofluorocarbon layer. In the adsorption process, the flow rates of $CH_3F$ and Ar gases may be about 3 and about 140 ml/minute, respectively. Ar gas flow of 150 ml/minute may be used in the desorption process. Microwave source powers in the adsorption and desorption processes are 400 and 350 watts, respectively. Wafer temperatures may be about 45° C. and 30° C. respectively in the adsorption and desorption processes.

Figure 9:
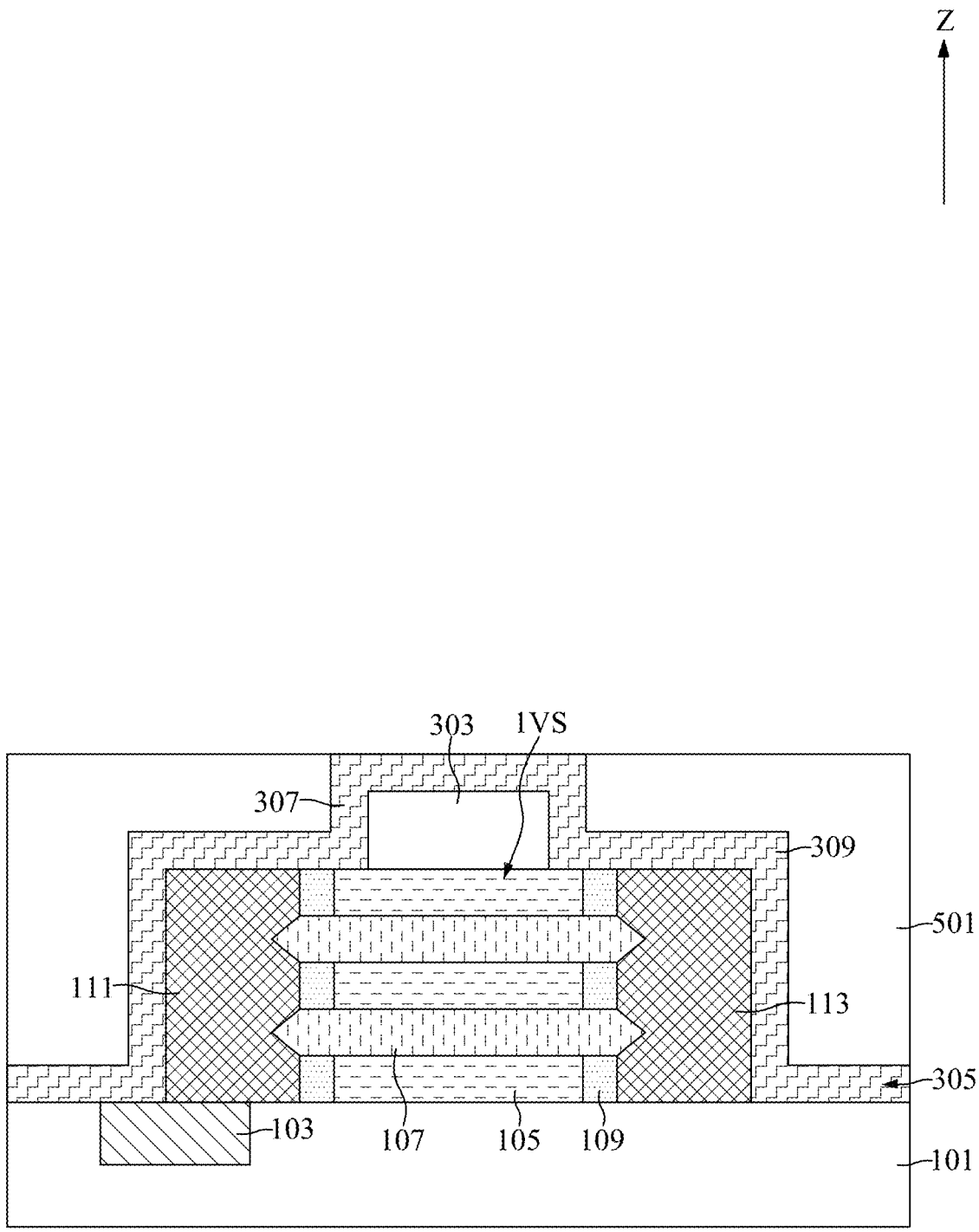

With reference to FIGS. 1 and 9, at step S23, a layer of first insulation material 305 may be formed to cover the first reduced dummy gate 303, the first vertical stack 1VS, the first impurity region 111, the second impurity region 113, and the first substrate 101 and a first insulation layer 501 may be formed on the layer of first insulation material 305.

With reference to FIG. 9, the layer of first insulation material 305 covered the sidewalls of the first reduced dummy gate 303 may be referred to as gate spacers 307. The layer of first insulation material 305 covered the first impurity region 111, the second impurity region 113, and the first substrate 101 may be referred to as covering portions 309. The layer of first insulation material 305 may have a thickness between about 4 nm and about 8 nm. The layer of first insulation material 305 may be formed by atomic layer deposition, chemical vapor deposition, the like, or a combination thereof. The first insulation material 305 may be, for example, silicon nitride or silicon carboxide. It should be noted that no additional etch process is applied for formation of the gate spacers 307.

With reference to FIG. 9, the first insulation layer 501 may be formed on the layer of first insulation material 305. A planarization process, such as chemical mechanical polishing, may be performed until the top surface of the layer of first insulation material 305 is exposed to provide a substantially flat surface for subsequent processing steps. The first insulation layer 501 may be formed of, for example, spin-on-glass, a flowable oxide, borosilicate glass, borophosphosilicate glass, phosphosilicate glass, undoped silicate glass, the like, or a combination thereof. The first insulation layer 501 may be formed by chemical vapor deposition, plasma-enhanced chemical vapor deposition, flowable chemical vapor deposition, the like, or a combination thereof.

Figure 10:
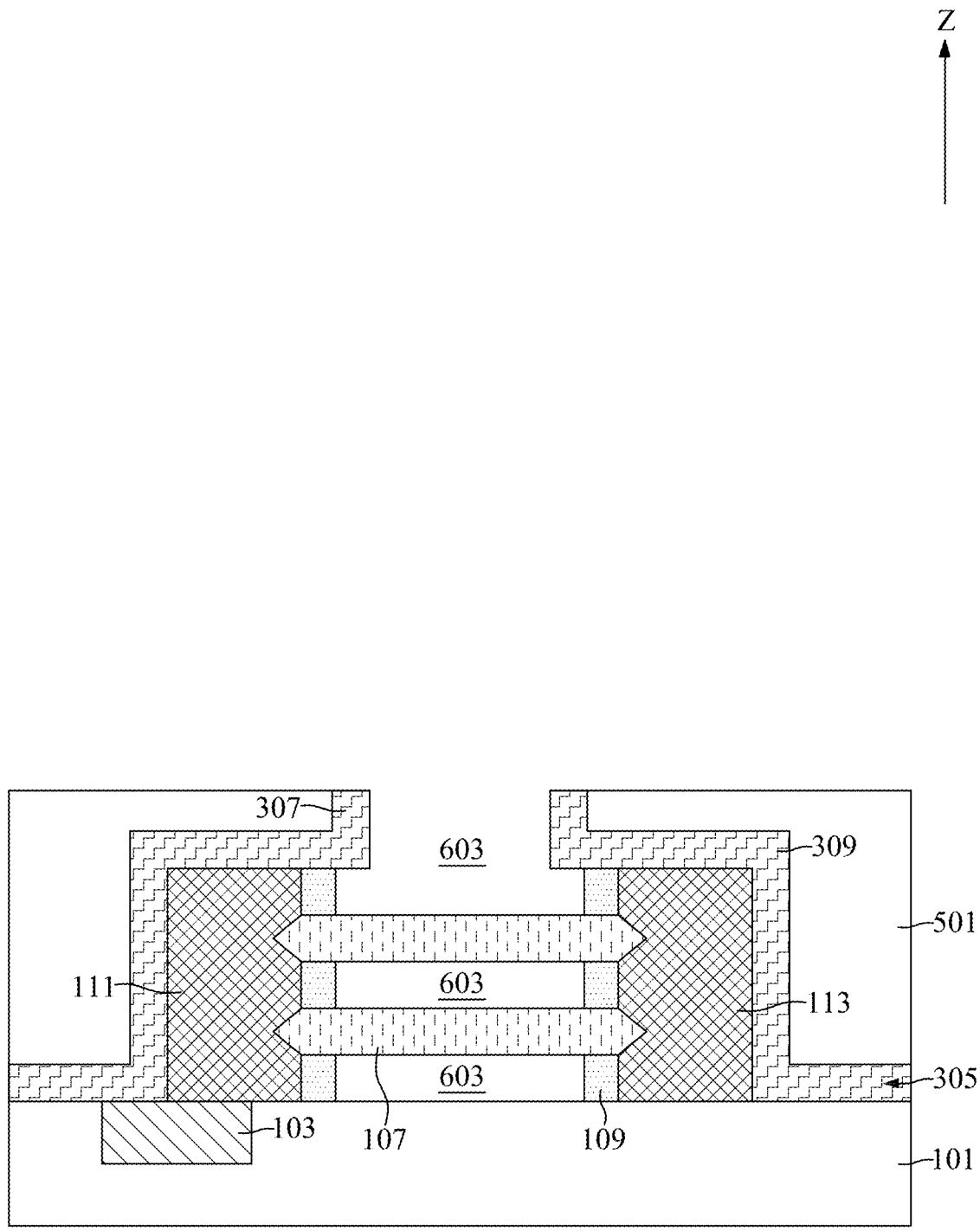

With reference to FIGS. 1 and 10, at step S25, the first reduced dummy gate 303 and the plurality of third semiconductor layers 105 may be removed to form plurality of first spaces 603.

With reference to FIG. 10, a planarization process, such as chemical mechanical polishing, may be performed to expose the first reduced dummy gate 303. In some embodiments, the first reduced dummy gate 303 may be removed by using hot phosphoric acid. The plurality of third semiconductor layers 105 may be subsequently removed by a selective etch process. The selective etch process may use hydrogen chloride gas or may be a wet etch process containing ammonia and hydroperoxide. In the present embodiment, the plurality of first spaces 603 may be formed between the gate spacers 307, between the plurality of first internal spacers 109, between the plurality of first semiconductor layers 107, and between the lowermost one of the plurality of first semiconductor layers 107 and the first substrate 101.

Figure 11:
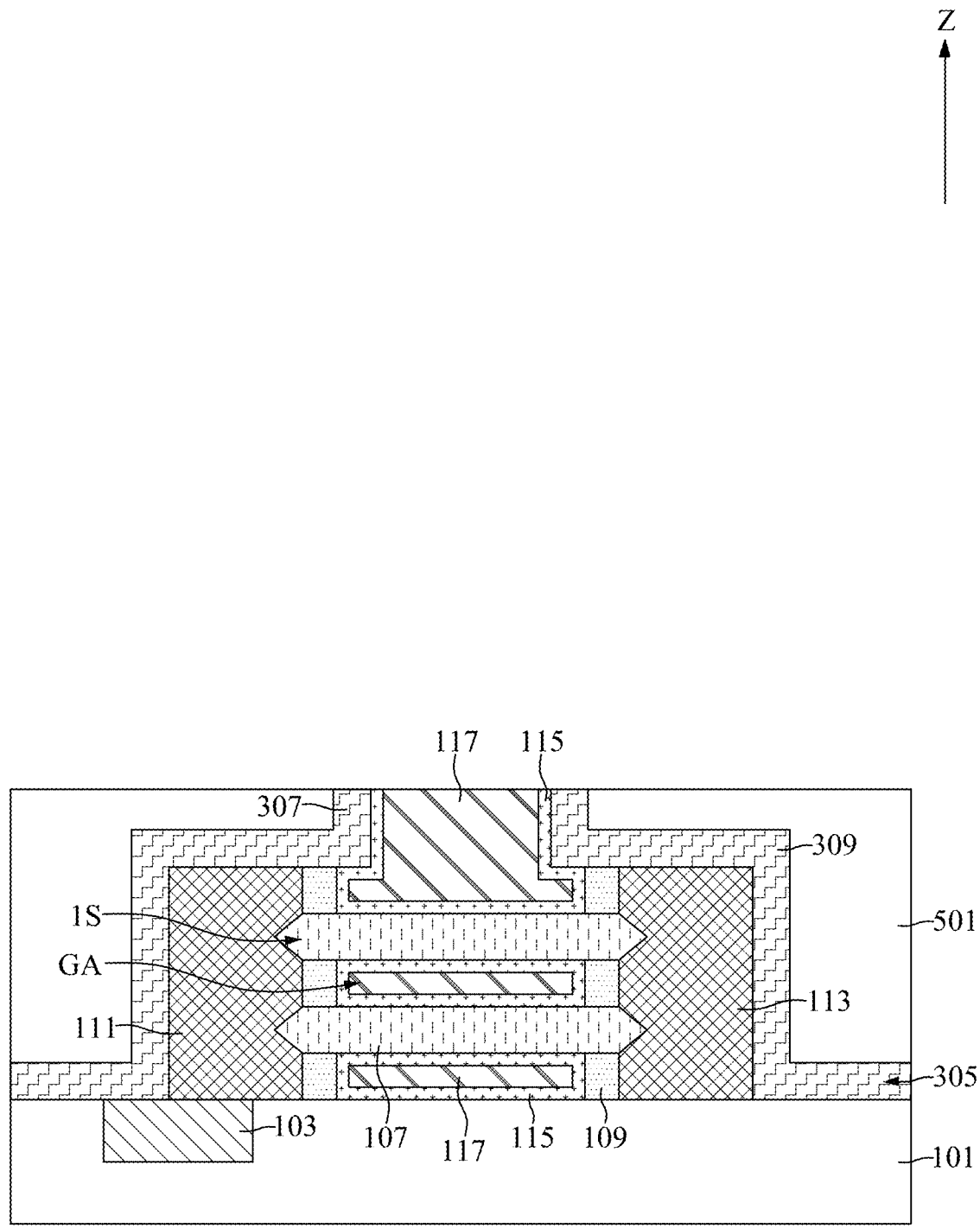

With reference to FIGS. 1 and 11, at step S27, a plurality of gate assemblies GA may be formed to fill the plurality of first spaces 603. The plurality of gate assemblies GA may include a gate dielectric 115 and a gate electrode 117.

With reference to FIG. 11, adjacent gate assemblies GA may be separated by the corresponding first semiconductor layer 107 interposed therebetween. The plurality of gate assemblies GA and the plurality of first semiconductor layers 107 together form a first stack structure 1S. The first stack structure 1S may be referred to as a gate-all-around type structure.

With reference to FIG. 11, the gate dielectric 115 may be conformally formed in the plurality of first spaces 603, on the plurality of first semiconductor layers 107, and on the inner sidewalls of the gate spacers 307. In some embodiments, a gate interfacial layer may be formed between the gate dielectric 115 and the plurality of first semiconductor layers 107. The gate interfacial layer may be formed of an oxide and may be formed by thermal oxidation, atomic layer deposition, chemical vapor deposition, or the like.

In some embodiments, the gate dielectric 115 may be formed of, for example, oxides, nitrides, oxynitrides, silicates (e.g., metal silicates), aluminates, titanates, nitrides, high-k materials, or any combination thereof. The high-k materials may have a k value greater than about 7.0 and may be a metal oxide or a silicate of Hf, Al, Zr, La, Mg, Ba, Ti, Pb, or a combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as, for example, lanthanum and aluminum.

The gate dielectric 115 may be formed by atomic layer deposition, chemical vapor deposition, molecular-beam deposition, plasma-enhanced chemical vapor deposition, chemical solution deposition, the like, or a combination thereof. The thickness of the gate dielectric 115 may vary depending on the deposition process as well as the composition and number of materials used. In some embodiments, the gate dielectric 115 may include multiple layers.

With reference to FIG. 11, the gate electrode 117 may be formed to completely fill the plurality of first spaces 603. A planarization process, such as chemical mechanical polishing, may be subsequently performed to remove excess material and provide a substantially flat surface for subsequent processing steps. In some embodiments, the gate electrode 117 may be a multi-layered structure.

For example, the gate electrode 117 may include a capping layer conformally formed on the gate dielectric 115, one or more work function adjusting layers conformally formed on the capping layer, and a filler layer, such as a metal, formed on the work function adjusting layers and completely filling the plurality of first spaces 603. In some embodiments, the capping layer may include a first sub-layer on the gate dielectric 115 formed of titanium nitride or the like using atomic layer deposition, chemical vapor deposition, or the like, and a second sub-layer on the first sub-layer formed of tantalum nitride or the like using atomic layer deposition, chemical vapor deposition, or the like.

In some embodiments, the work function adjusting layer(s) may be formed of, for example, p-type work function metal materials and n-type work function metal materials. The p-type work function materials may include compositions such as ruthenium, palladium, platinum, cobalt, nickel, and conductive metal oxides, titanium nitride, or a combination thereof. The n-type metal materials may include compositions such as hafnium, zirconium, titanium, tantalum, aluminum, metal carbides (e.g., hafnium carbide, zirconium carbide, titanium carbide, and aluminum carbide), aluminides, or a combination thereof. The work function adjusting layer(s) may be formed by using atomic layer deposition, chemical vapor deposition, or the like. The work function adjusting layer(s) may set the threshold voltage (Vt) of the semiconductor device 1A to a predetermined value. In some embodiments, the work function adjusting layer(s) serves dual purposes: Vt setting and gate conductor.

In some embodiments, the filler layer may be formed of, for example, tungsten, aluminum, cobalt, ruthenium, gold, silver, titanium, platinum, the like, or a combination thereof and may be deposited using chemical vapor deposition, physical vapor deposition, plating, thermal or e-beam evaporation, the like, or a combination thereof.

Figure 12:
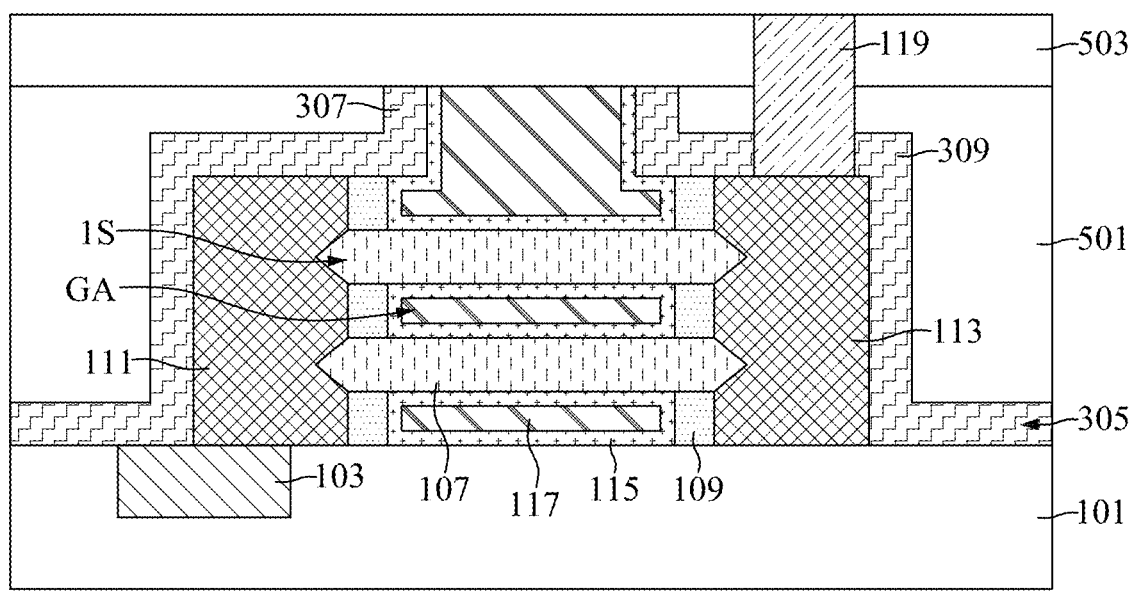

With reference to FIGS. 1 and 12, at step S29, a middle insulation layer 503 may be formed on the first insulation layer 501 and a first conductive plug 119 may be formed to electrically connect the second impurity region 113.

With reference to FIG. 12, the middle insulation layer 503 may be formed on the first insulation layer 501, the gate spacers 307, and the first stack structure 1S. The middle insulation layer 503 may be formed of, for example, silicon nitride, silicon oxynitride, silicon oxide nitride, polyimide, polybenzoxazole, or a combination thereof. The middle insulation layer 503 may protect the elements underneath the middle insulation layer 503 from damage and contamination.

With reference to FIG. 12, the first conductive plug 119 may be formed along the middle insulation layer 503, the first insulation layer 501, the covering portion 309, and on the second impurity region 113. The first conductive plug 119 may be electrically connected to the second impurity region 113. The first conductive plug 119 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

With reference to FIG. 1 and FIGS. 13 to 20, at step S31, a second substrate 201 may be provided and a second stack structure 2S may be formed on the second substrate 201.

Figure 13:
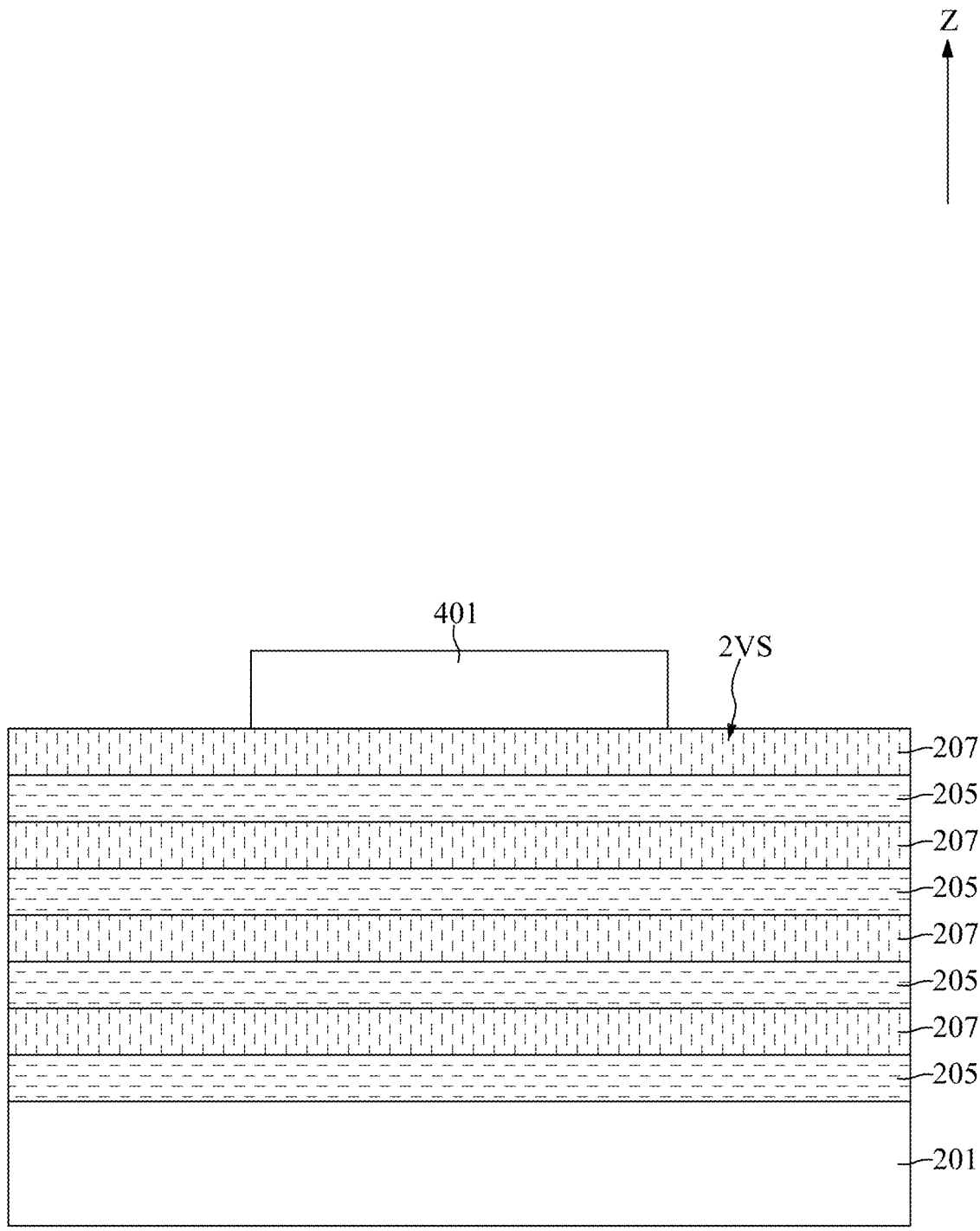

With reference to FIG. 13, the second substrate 201 may have a similar structure to the first substrate 101 and may be formed of a same material as the first substrate 101. A second vertical stack 2VS may be formed on the first substrate 101. The second vertical stack 2VS may include a plurality of fourth semiconductor layers 205 and a plurality of second semiconductor layers 207. The plurality of fourth semiconductor layers 205 and the plurality of second semiconductor layers 207 may be formed with a procedure similar to the plurality of third semiconductor layers 105 and the plurality of first semiconductor layers 107 illustrated in FIG. 3. For example, each of the plurality of fourth semiconductor layers 205 is a layer of $Si_{0.50}Ge_{0.50}$ and each of the plurality of second semiconductor layers 207 is a layer of Si. In the present embodiment, the lowermost one of the plurality of fourth semiconductor layers 205 directly contacts the top surface of the second substrate 201. The second dummy gate 401 may be formed on the second vertical stack 2VS with a procedure similar to that illustrated in FIG. 3.

Figure 14:
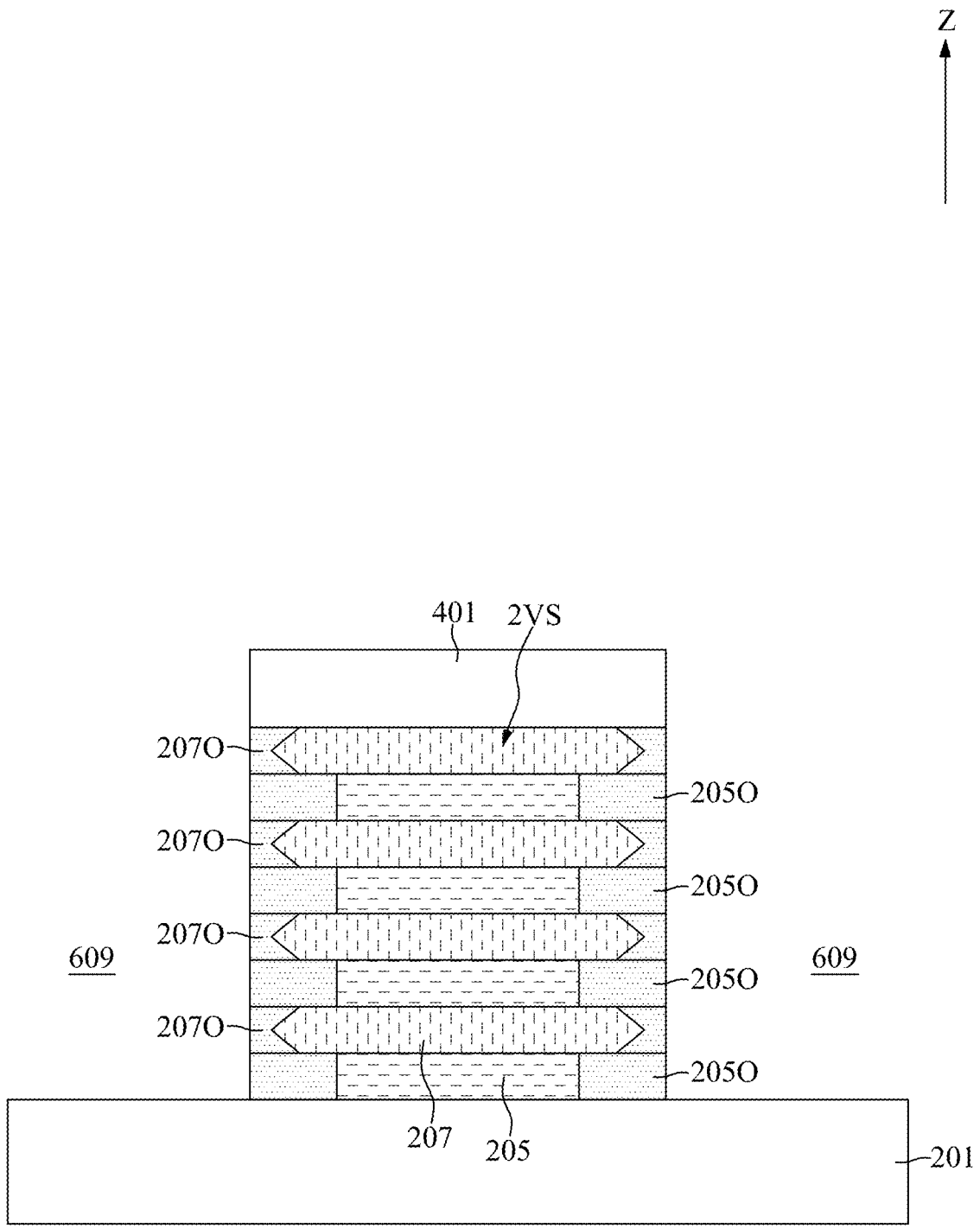

With reference to FIG. 14, an etch process may be performed to the intermediate semiconductor device illustrated in FIG. 13 to form second trenches 609 on opposing sides of the second vertical stack 2VS. The second dummy gate 401 may serve as a protective mask during the etch process. The etch process may be performed with a procedure similar to that illustrated in FIG. 4. After the etch process, side portions of the plurality of fourth semiconductor layers 205 and side portions of the plurality of second semiconductor layers 207 may be exposed through the second trenches 609.

With reference to FIG. 14, a low-temperature oxidation process, which is similar to that illustrated in FIG. 5, may be conducted to oxidize the exposed side portions of the plurality of fourth semiconductor layers 205 and the plurality of second semiconductor layers 207. Accordingly, fourth side-portion oxides 205O may be formed on opposing sides of the plurality of fourth semiconductor layers 205 and second side-portion oxides 207O may be formed on opposing sides of the plurality of second semiconductor layers 207. The plurality of fourth semiconductor layers 205 formed of $Si_{0.50}Ge_{0.50}$ may oxidize at least ten times faster than the plurality of second semiconductor layers 207 formed of Si under such condition. As a result, fourth side-portion oxides 205O formed during the low-temperature oxidation process may be relatively thicker than the second side-portion oxides 207O formed during the low-temperature oxidation process.

Figure 15:
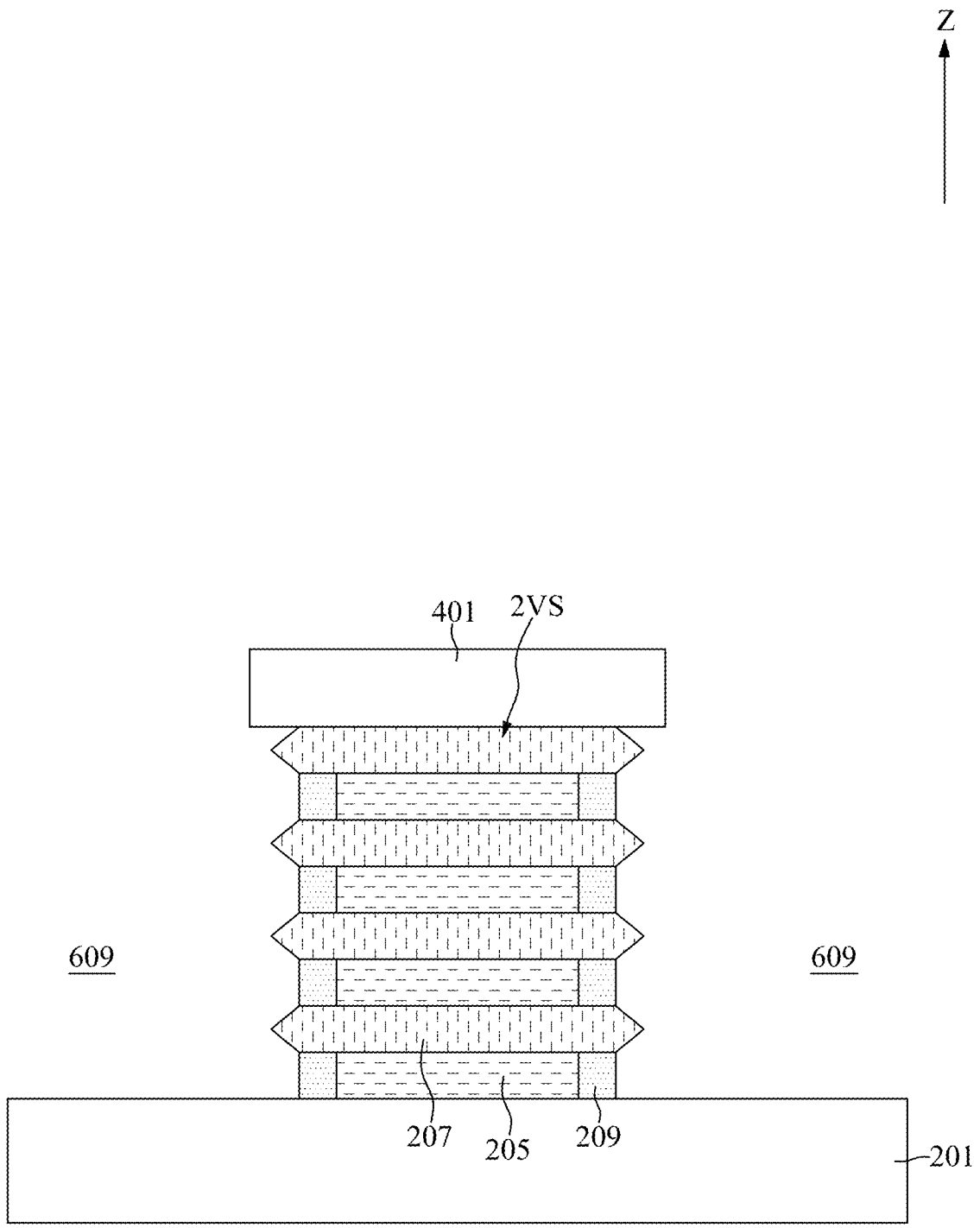

With reference to FIG. 15, the second side-portion oxides 207O may be removed to expose the plurality of second semiconductor layers 207. An oxide etch process, which is similar to that illustrated in FIG. 6, may be performed to remove the second side-portion oxides 207O. It should be noted that portions of the fourth side-portion oxides 205O may also be removed. However, due to the fourth side-portion oxides 205O are thicker than the second side-portion oxides 207O, the fourth side-portion oxides 205O may still cover the plurality of fourth semiconductor layers 205 after the removal of the second side-portion oxides 207O. The remained fourth side-portion oxides 205O may be referred to as a plurality of second internal spacers 209.

Figure 16:
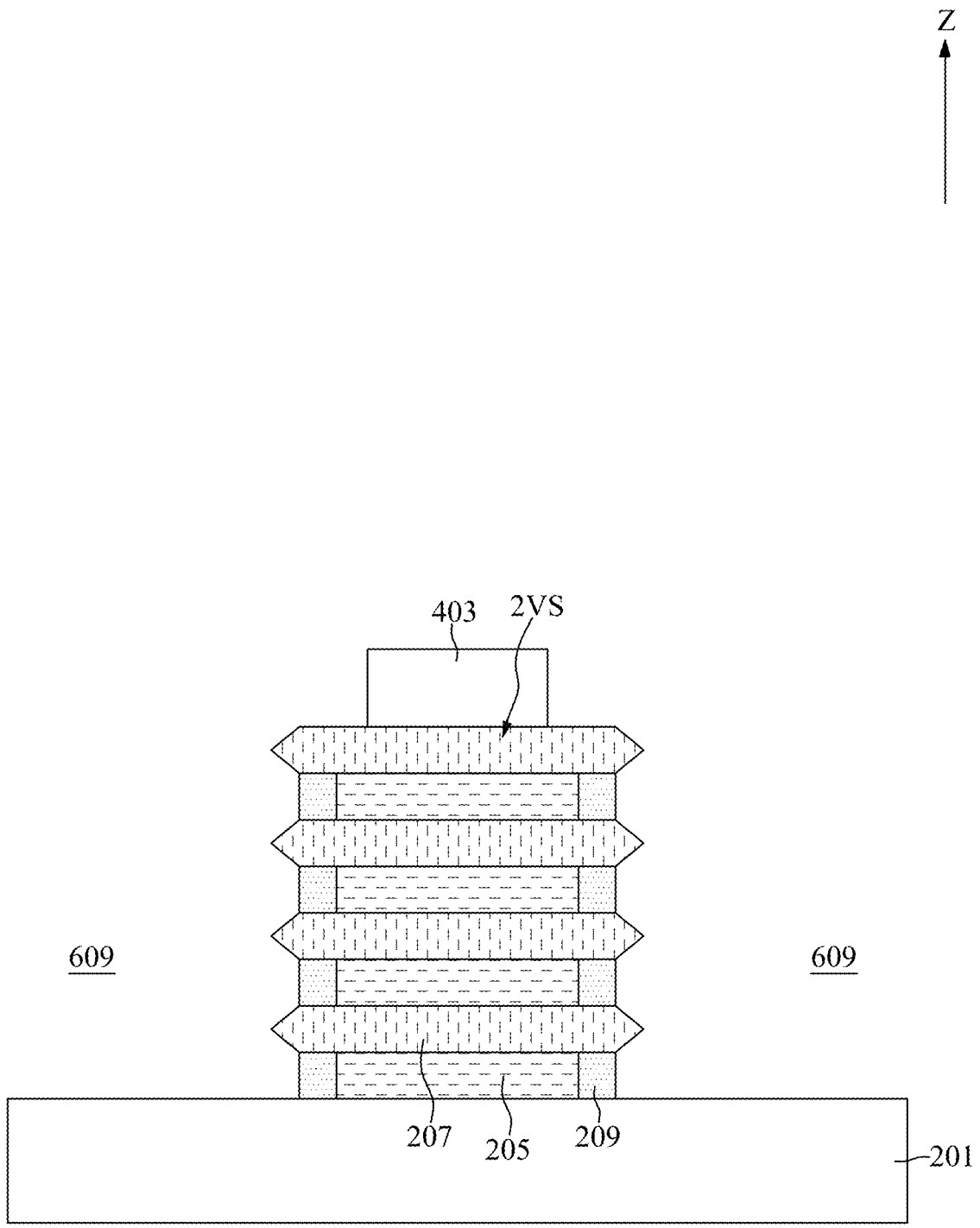

With reference to FIG. 16, the first dummy gate 301 may be trimmed to form a first reduced dummy gate 303 with a procedure similar to that illustrate in FIG. 8. The width of the second reduced dummy gate 403 may be less than the width of the plurality of fourth semiconductor layers 205 or the width of the plurality of second semiconductor layers 207.

Figure 17:
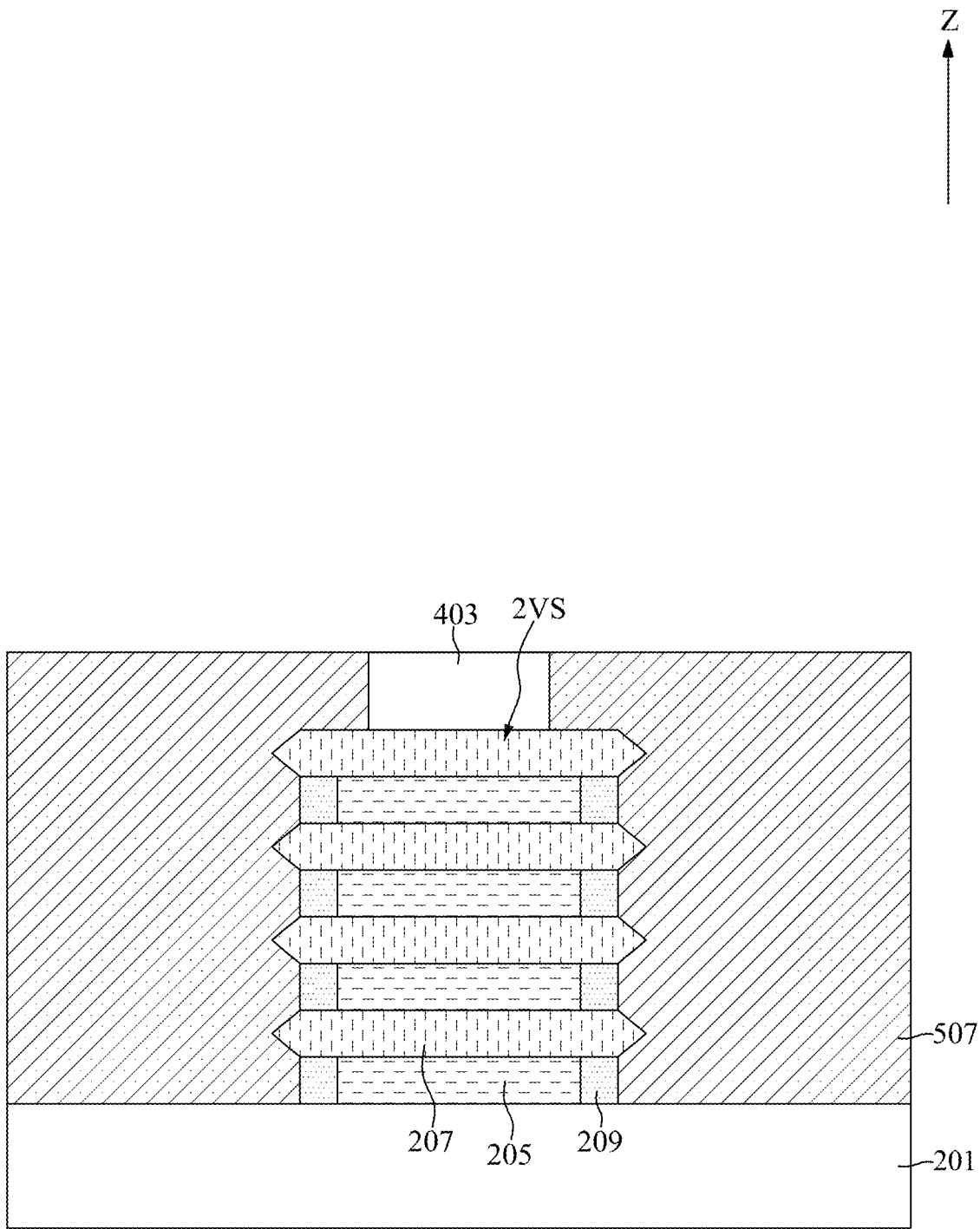

With reference to FIG. 17, a sacrificial insulation layer 507 may be formed to cover the second vertical stack 2VS, the second substrate 201, the plurality of second internal spacers 209, and the second reduced dummy gate 403. A planarization process, such as chemical mechanical polishing, may be performed until the top surface of the second reduced dummy gate 403 is exposed to remove excess material and provide a substantially flat surface for subsequent processing steps. In some embodiments, the sacrificial insulation layer 507 may be formed of a material having selectivity to the second reduced dummy gate 403, the plurality of fourth semiconductor layers 205, the plurality of second semiconductor layers 207, and the plurality of second internal spacers 209. In some embodiments, the sacrificial insulation layer 507 may be a carbon film. The term "carbon film" is meant to exclude materials that are simply mixtures or compounds that include carbon, for example dielectric materials such as carbon-doped silicon oxynitride, carbon-doped silicon oxide or carbon-doped polysilicon.

Figure 18:
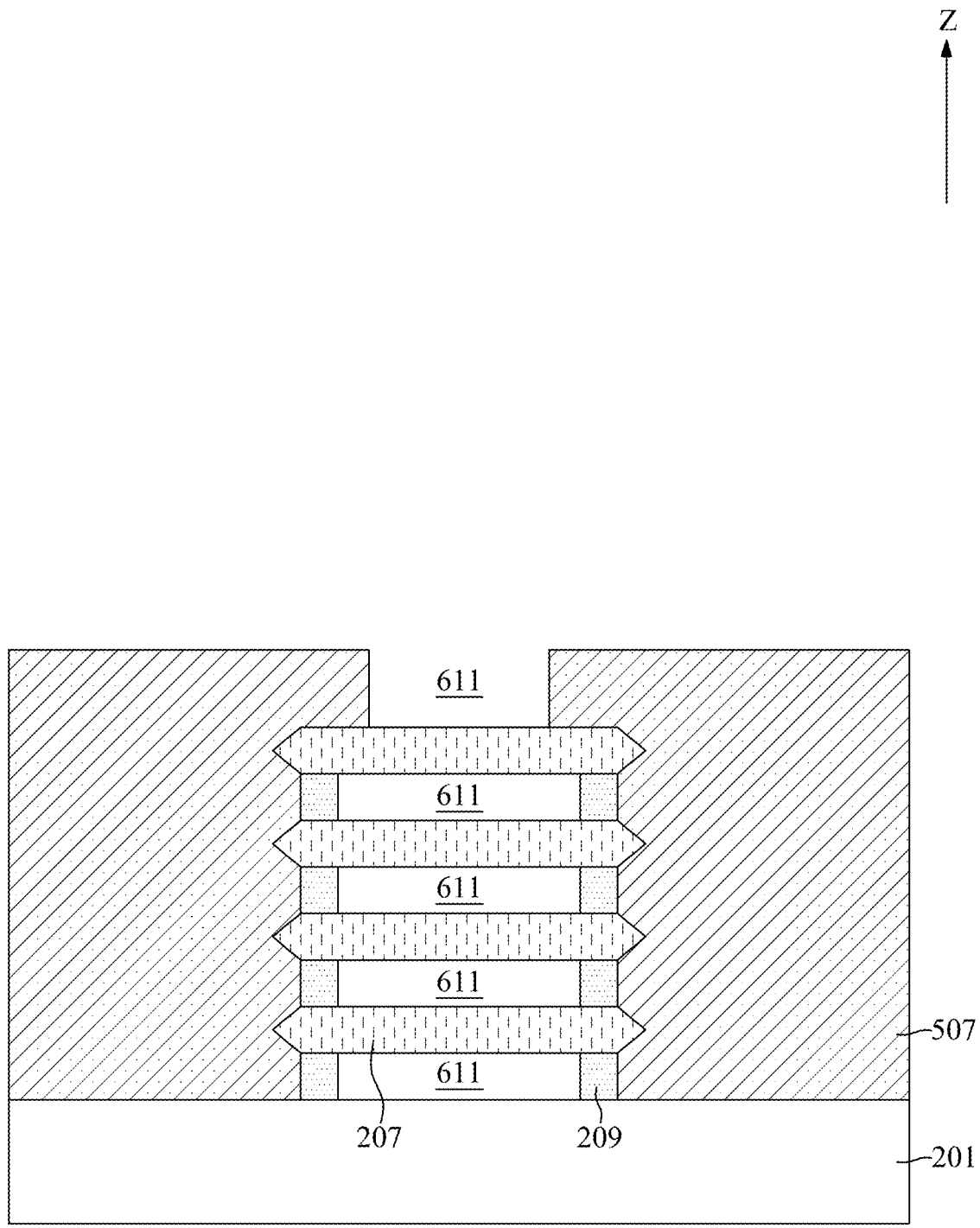

With reference to FIG. 18, the second reduced dummy gate 403 and the plurality of fourth semiconductor layers 205 may be removed with a procedure similar to the removal of the first reduced dummy gate 303 and the plurality of third semiconductor layers 105 illustrated in FIG. 10. As a result, a plurality of second spaces 611 may be formed at places where the second reduced dummy gate 403 and the plurality of fourth semiconductor layers 205 previous occupied.

Figure 19:
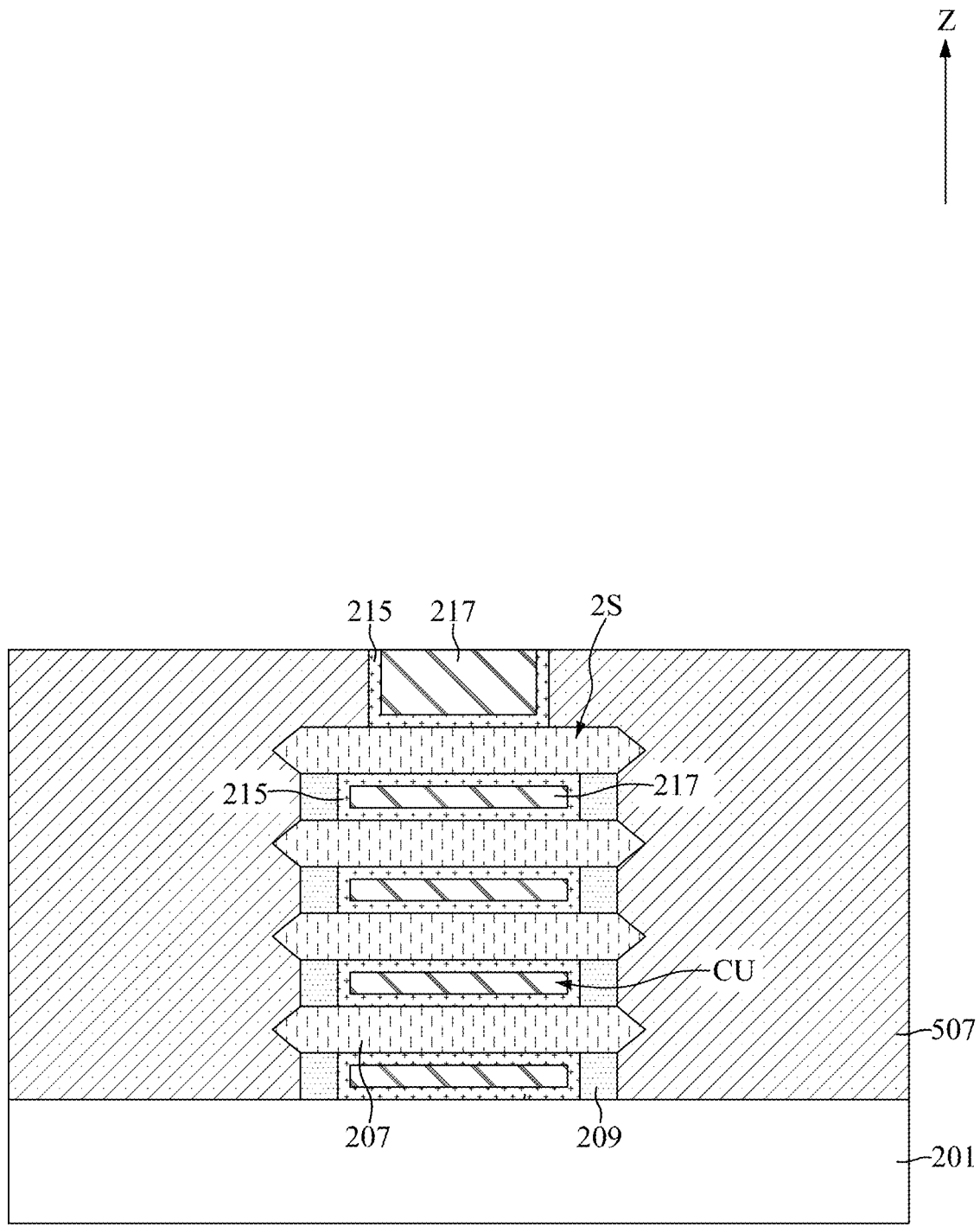

With reference to FIG. 19, a capacitor dielectric 215 may be conformally form in the plurality of second spaces 611 and on the plurality of second semiconductor layers 207. In some embodiments, the capacitor dielectric 215 may be formed of a same material as the gate dielectric 115. In some embodiments, the capacitor dielectric 215 may be formed of, for example, silicon oxide. A capacitor electrode 217 may be formed to completely fill the plurality of second spaces 611. A planarization process, such as chemical mechanical polishing, may be optionally performed to remove excess material and provide a substantially flat surface for subsequent processing steps. In some embodiments, the capacitor electrode 217 may have a structure similar to the gate electrode 117 and may be formed of a same material as the gate electrode 117. In some embodiments, the capacitor electrode 217 may be formed of polycrystalline silicon, doped polycrystalline silicon, polycrystalline silicon germanium, or doped polycrystalline silicon germanium.

With reference to FIG. 19, the capacitor dielectric 215 and the capacitor electrode 217 together configure a plurality of capacitor sub-units CU. Adjacent capacitor sub-units CU may be separated by the corresponding second semiconductor layer 207 interposed therebetween. The plurality of capacitor sub-units CU and the plurality of second semiconductor layers 207 together configure the second stack structure 2S. The second stack structure 2S may serve as a memory to storage binary information such as "1" or "0". The second stack structure 2S may be referred to as dielectric-all-around type capacitor. The plurality of first semiconductor layers 107 may be serve as one electrode of a capacitor structure. The capacitor electrode 217 may be serve as the other electrode of the capacitor structure. The capacitor dielectric 215 may be serve as the insulation layer to separate the two electrodes of the capacitor structure.

Figure 20:
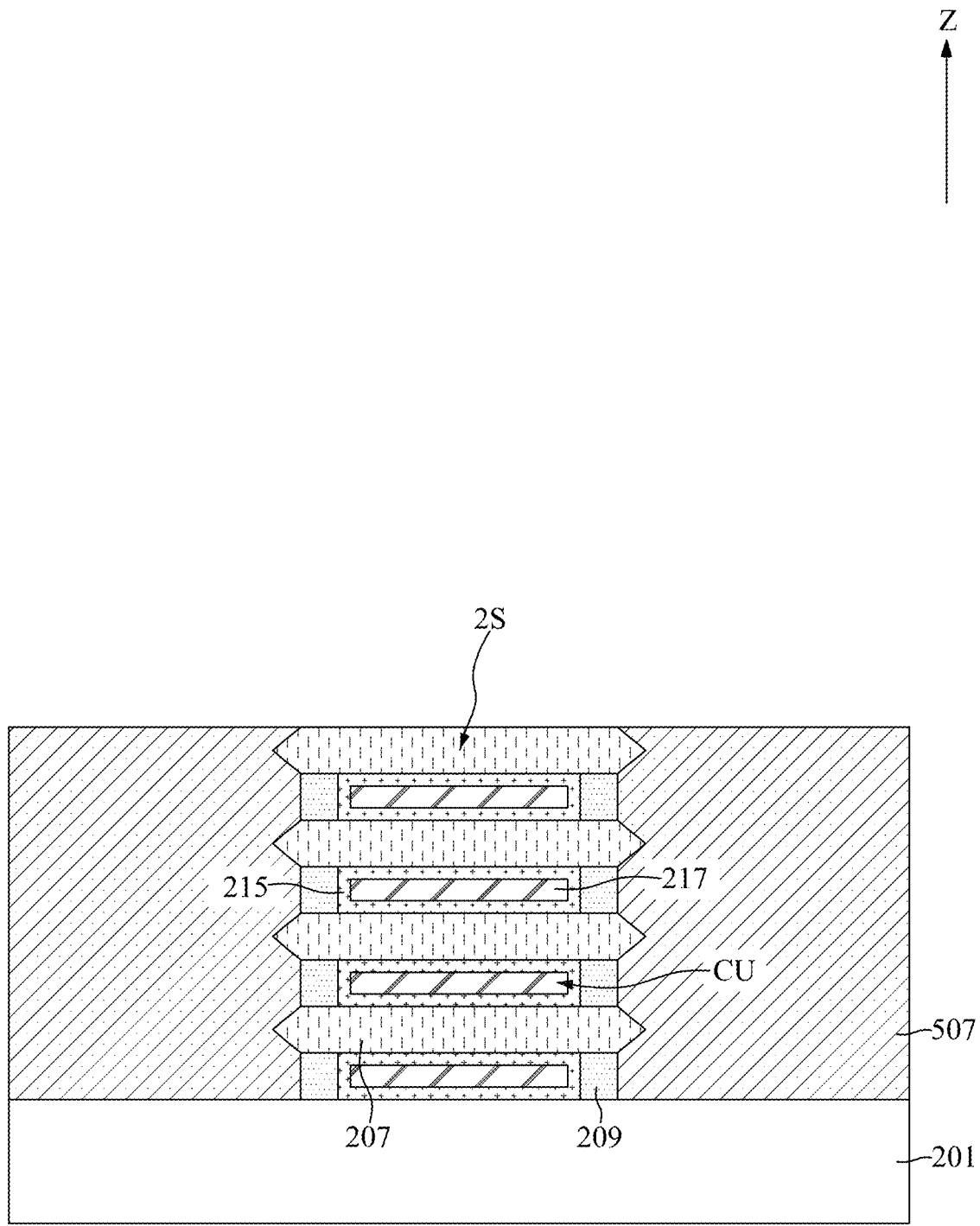

With reference to FIG. 20, a planarization process, such as chemical mechanical polishing, may be performed to expose the topmost one of the plurality of second semiconductor layers 207. In some embodiments, the planarization process may be performed to provide a substantially flat surface for subsequent processing steps. In some embodiments, the planarization process may be performed to expose the top surfaces of topmost one of the plurality of second internal spacers 209.

With reference to FIG. 1 and FIGS. 21 to 23, at step S33, the second stack structure 2S may be bonded onto the middle insulation layer 503.

Figure 21:
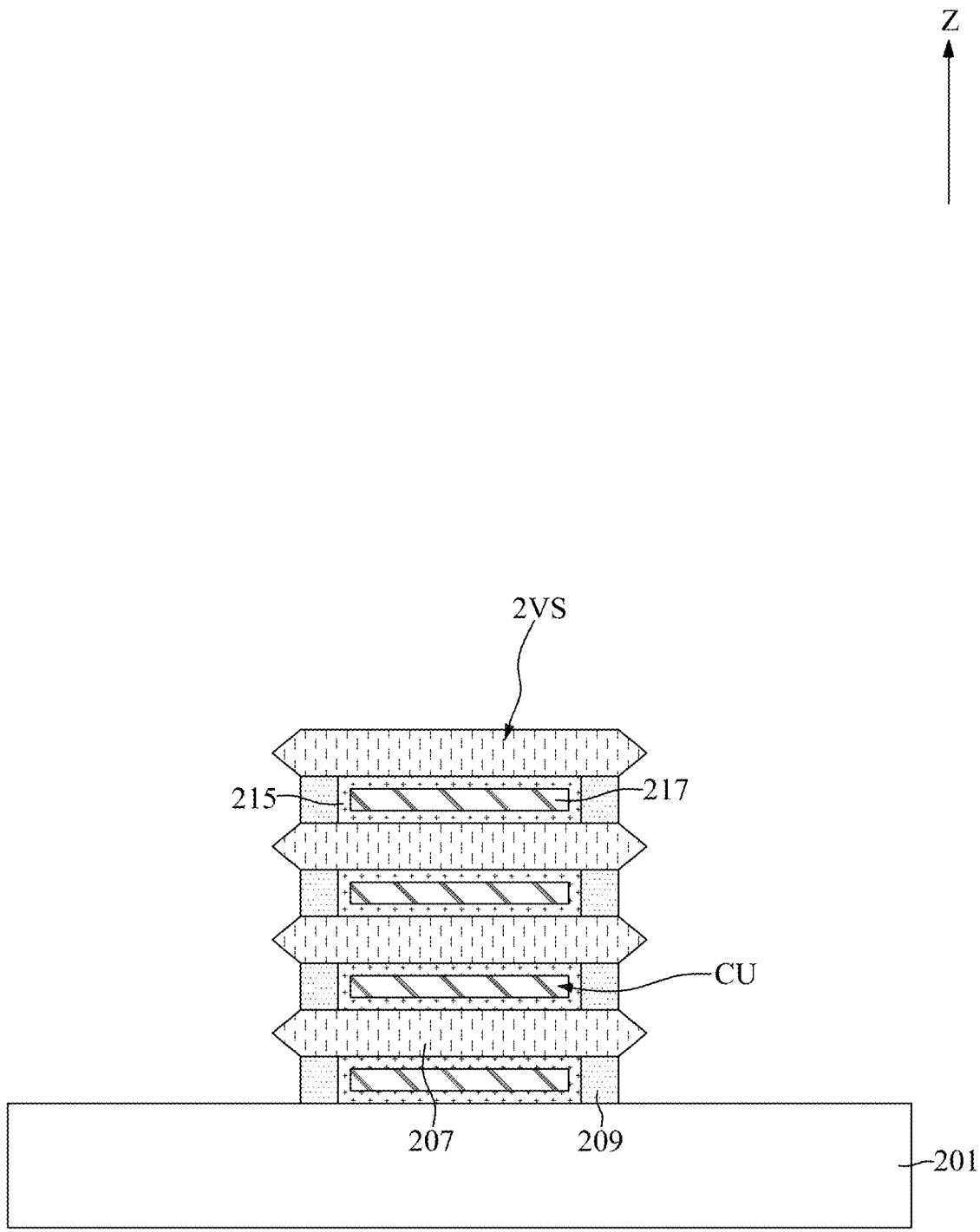

With reference to FIG. 21, the sacrificial insulation layer 507 may be removed by an etch process. The etch rate ratio of the sacrificial insulation layer 507 to the plurality of second semiconductor layers 207 may be between about 100:1 and about 1.05:1, between about 15:1 and about 2:1, or between about 10:1 and about 2:1 during the etch process. The etch rate ratio of the sacrificial insulation layer 507 to the capacitor dielectric 215 may be between about 100:1 and about 1.05:1, between about 15:1 and about 2:1, or between about 10:1 and about 2:1 during the etch process. The etch rate ratio of the sacrificial insulation layer 507 to the plurality of second internal spacers 209 may be between about 100:1 and about 1.05:1, between about 15:1 and about 2:1, or between about 10:1 and about 2:1 during the etch process. The etch rate ratio of the sacrificial insulation layer 507 to the second substrate 201 may be between about 100:1 and about 1.05:1, between about 15:1 and about 2:1, or between about 10:1 and about 2:1 during the etch process.

Figure 22:
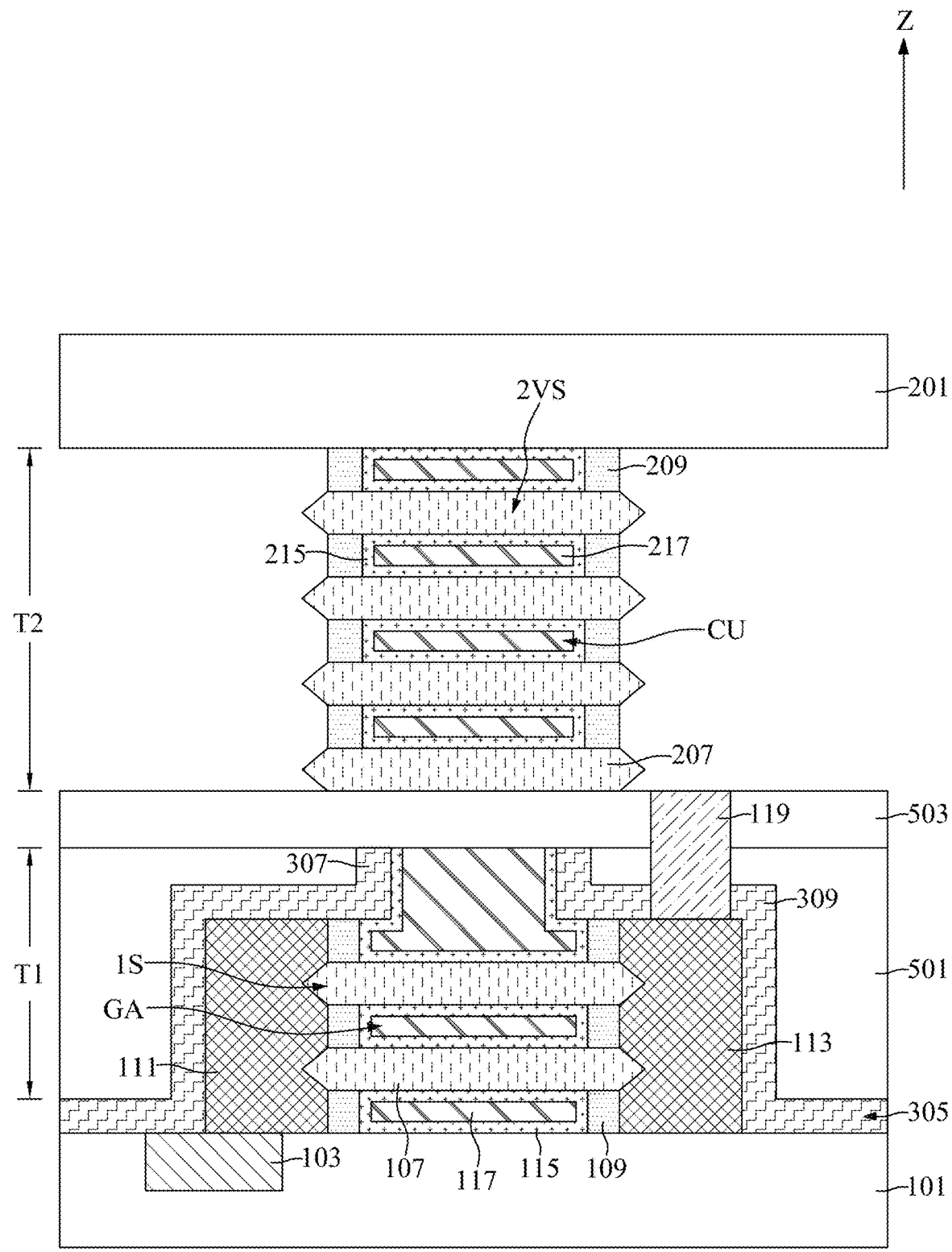
Figure 23:
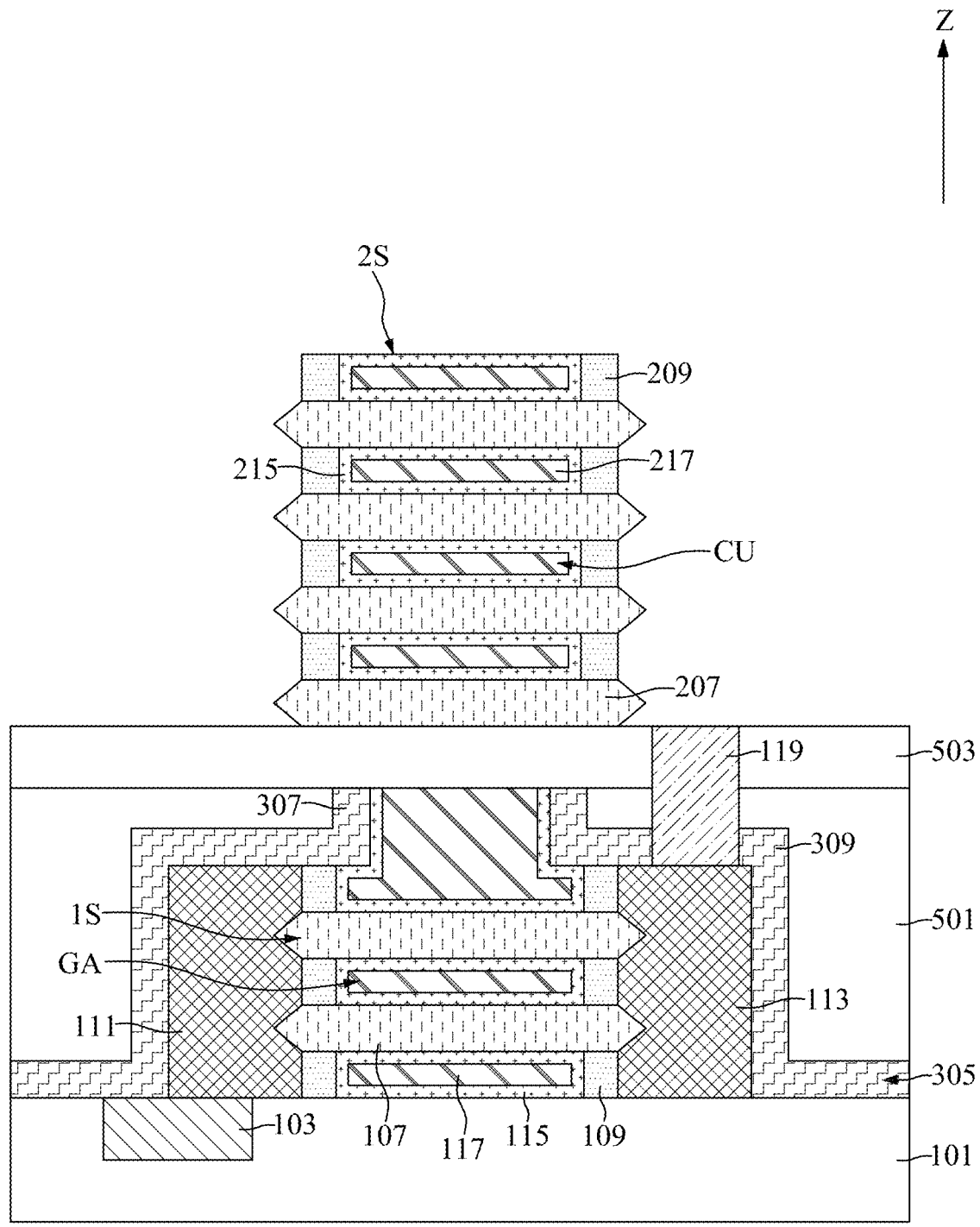

With reference to FIG. 22, the intermediate semiconductor device illustrated in FIG. 21 may be placed up-side down and bonded onto the middle insulation layer 503. The second stack structure 2S may be vertically overlapped with the first stack structure 1S. In the present embodiment, the lowermost one of the plurality of second semiconductor layers 207 directly contacts the top surface of the middle insulation layer 503.

With reference to FIG. 22, the second substrate 201 may be removed by an etch process or a grinding process. The etch process may be selective to the second substrate 201. In some embodiments, the sacrificial insulation layer 507 may be retained until the removal of the second substrate 201. The retained sacrificial insulation layer 507 may provide additional structural support during the removal of the second substrate 201. In some embodiments, the thickness T1 of the first stack structure 1S may be less than the thickness T2 of the second stack structure 2S. In some embodiments, the thickness T1 of the first stack structure 1S may be equal to the thickness T2 of the second stack structure 2S. In some embodiments, the thickness T1 of the first stack structure 1S may be greater than the thickness T2 of the second stack structure 2S.

Figure 24:
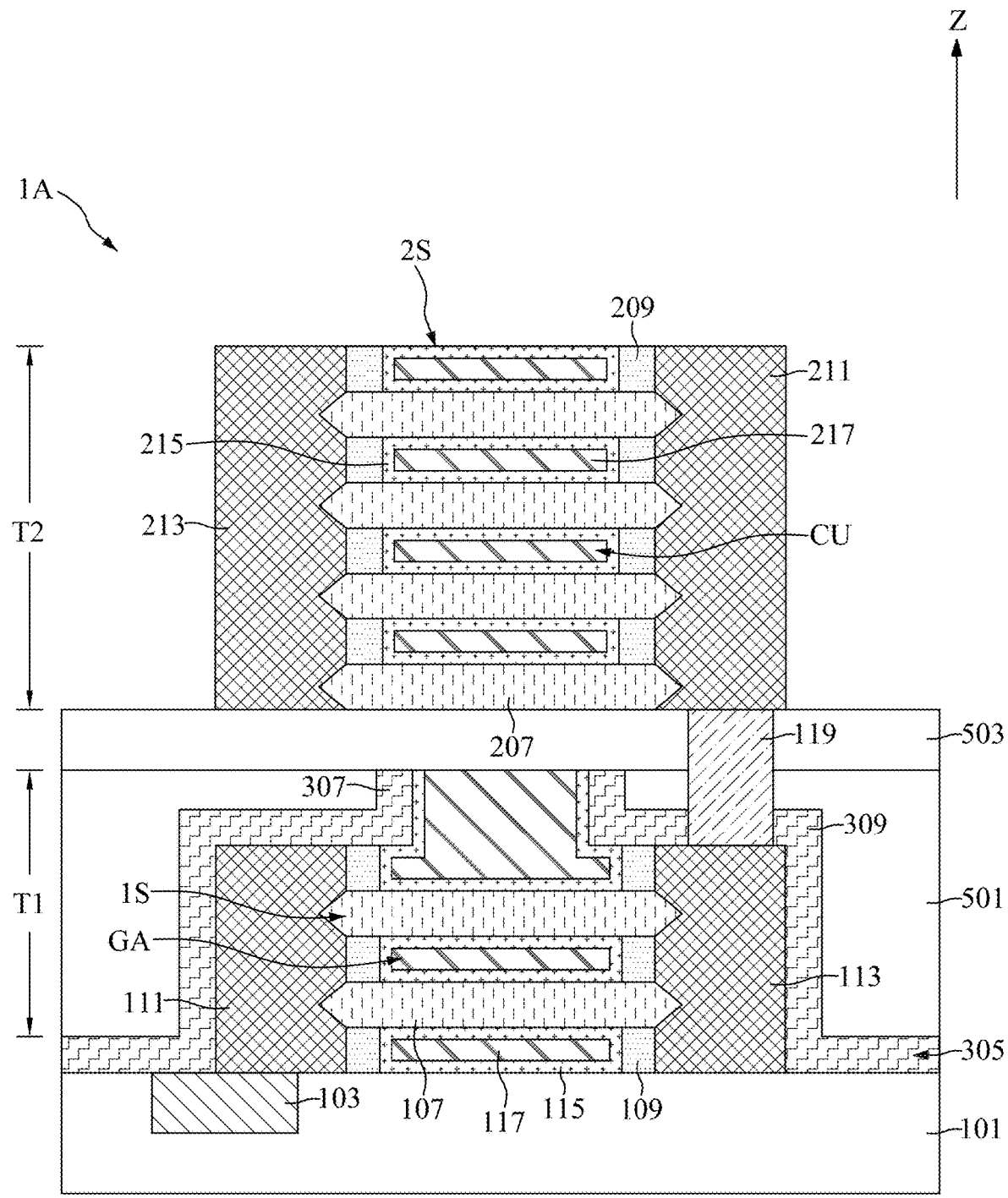

With reference to FIGS. 1 and 24, at step S35, a fourth impurity region 213 and a third impurity region 211 may be formed on opposing sides of the second stack structure 2S.

With reference to FIG. 24, the third impurity region 211 may be electrically connected to the first conductive plug 119. In some embodiments, the third impurity region 211 and the fourth impurity region 213 may be operatively associated with the plurality of second semiconductor layers 207. The third impurity region 211 and the fourth impurity region 213 may be formed with a procedure similar to the first impurity region 111 and the second impurity region 113 illustrated in FIG. 7.

FIGS. 25 to 28 illustrate, in schematic cross-sectional view diagrams, some semiconductor devices 1B, 1C, 1D, and 1E in accordance with some embodiments of the present disclosure.

Figure 25:
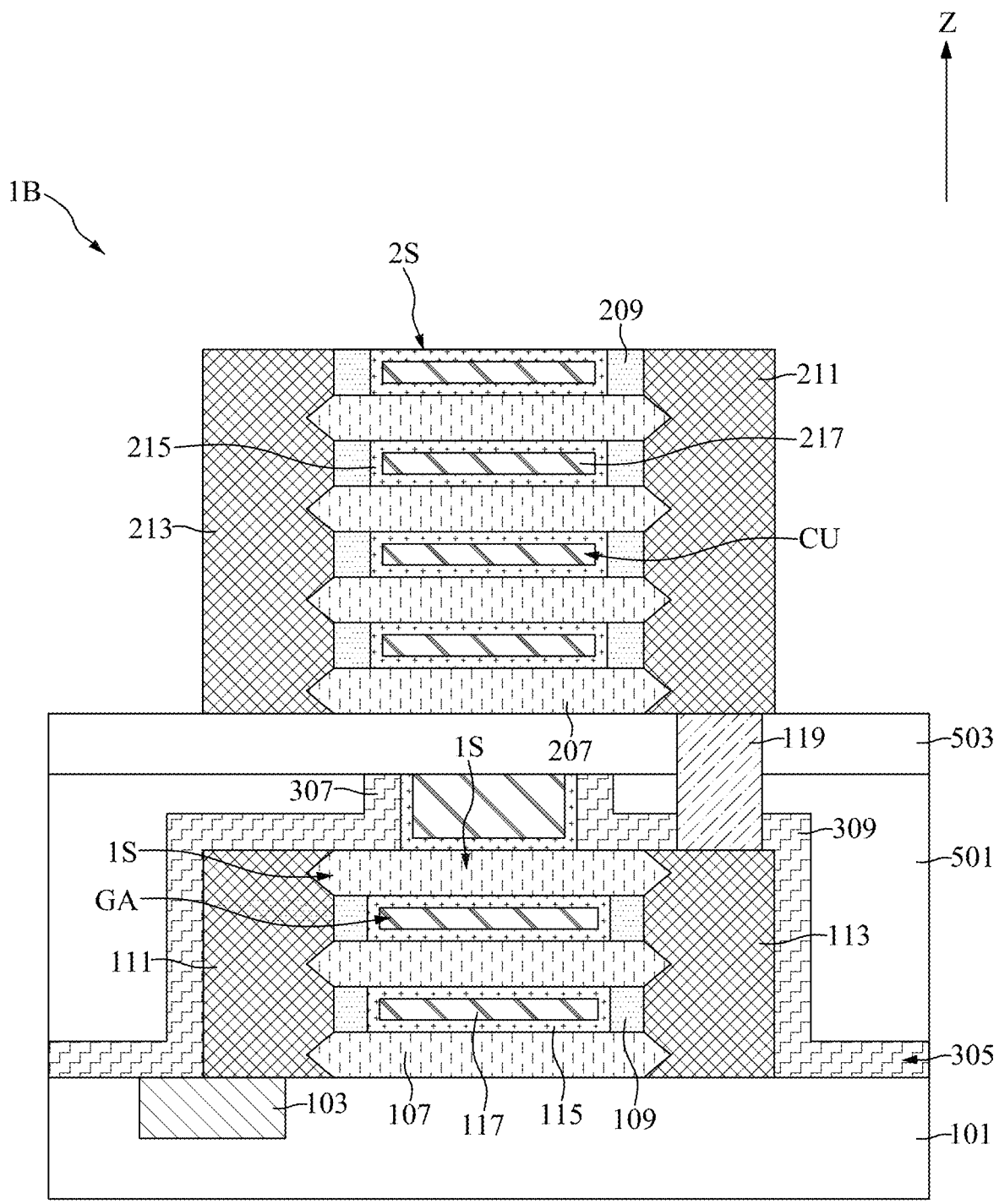
FIGS. 25 to 28 illustrate, in schematic cross-sectional view diagrams, some semiconductor devices in accordance with some embodiments of the present disclosure.

With reference to FIG. 25, the semiconductor device 1B may have a structure similar to that illustrated in FIG. 24. The same or similar elements in FIG. 25 as in FIG. 24 have been marked with similar reference numbers and duplicative descriptions have been omitted. In the present embodiment, the lowermost one of the plurality of first semiconductor layers 107 directly contacts the top surface of the first substrate 101.

Figure 26:
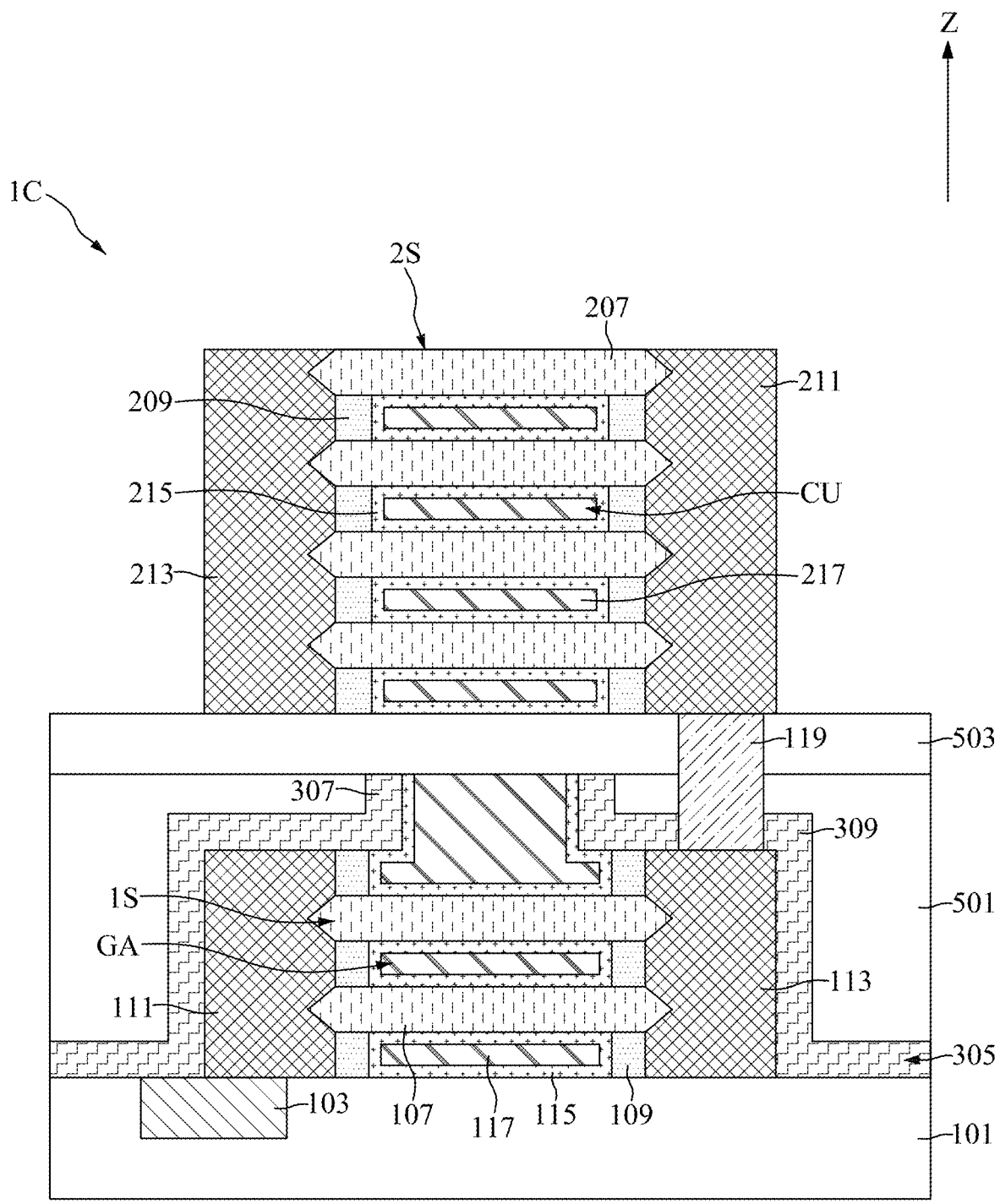

With reference to FIG. 26, the semiconductor device 1C may have a structure similar to that illustrated in FIG. 24. The same or similar elements in FIG. 26 as in FIG. 24 have been marked with similar reference numbers and duplicative descriptions have been omitted. In the present embodiment, the lowermost one of the plurality of capacitor sub-units CU directly contacts the top surface of the middle insulation layer 503.

Figure 27:
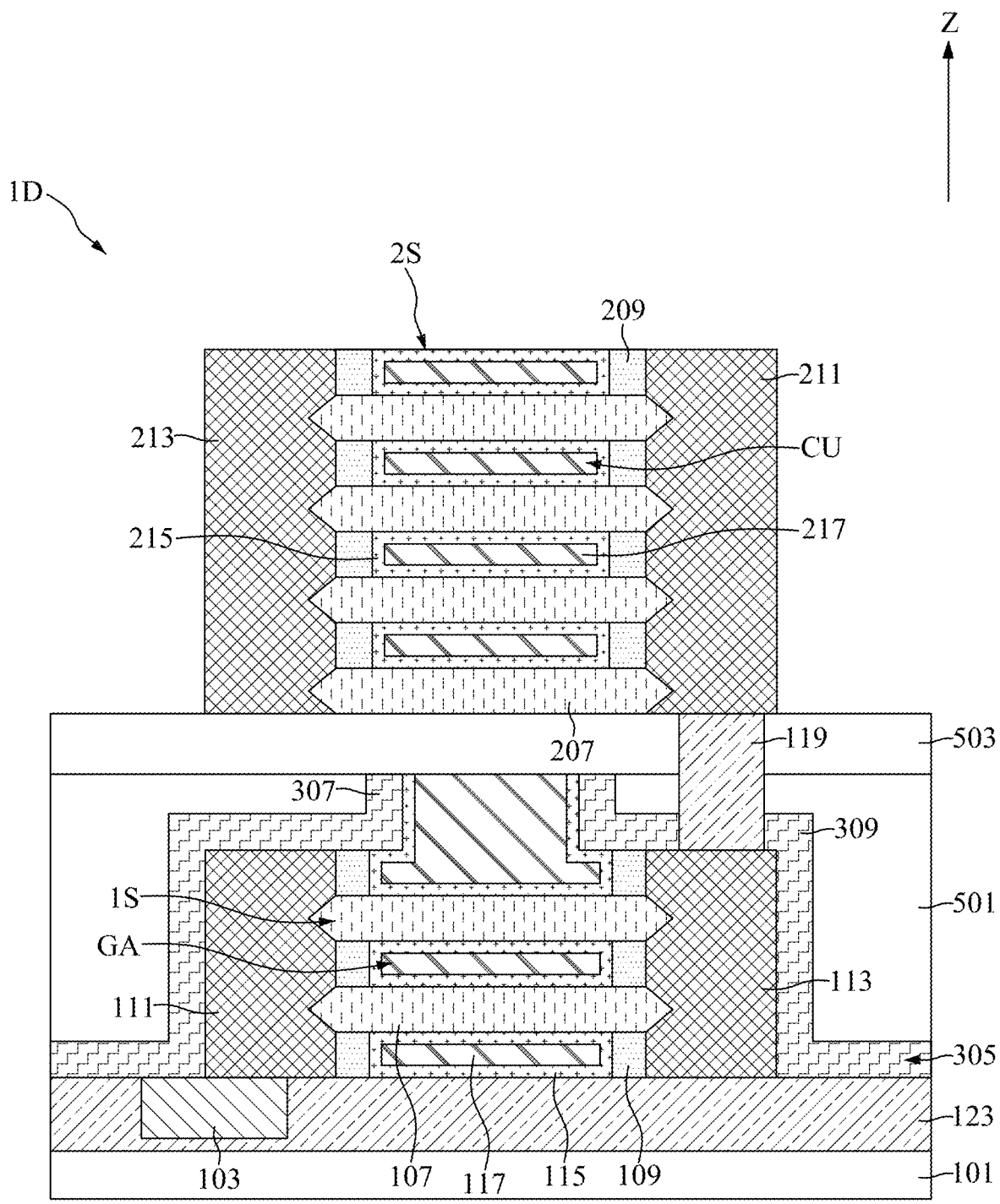

With reference to FIG. 27, the semiconductor device 1D may have a structure similar to that illustrated in FIG. 24. The same or similar elements in FIG. 27 as in FIG. 24 have been marked with similar reference numbers and duplicative descriptions have been omitted. The semiconductor device 1D may include a buried insulation layer 123 disposed in the first substrate 101. The buried bit line 103 may be disposed in the buried insulation layer 123. The first stack structure 1S, the first impurity region 111, and the second impurity region 113 may be disposed on the buried insulation layer 123. The buried insulation layer 123 may be formed of, for example, silicon oxide, silicon nitride, silicon oxynitride, boron nitride, aluminum oxide, or a combination thereof. The buried insulation layer 123 may serve as an etch stop during formation of the first trenches 601 as illustrated in FIG. 4.

Figure 28:
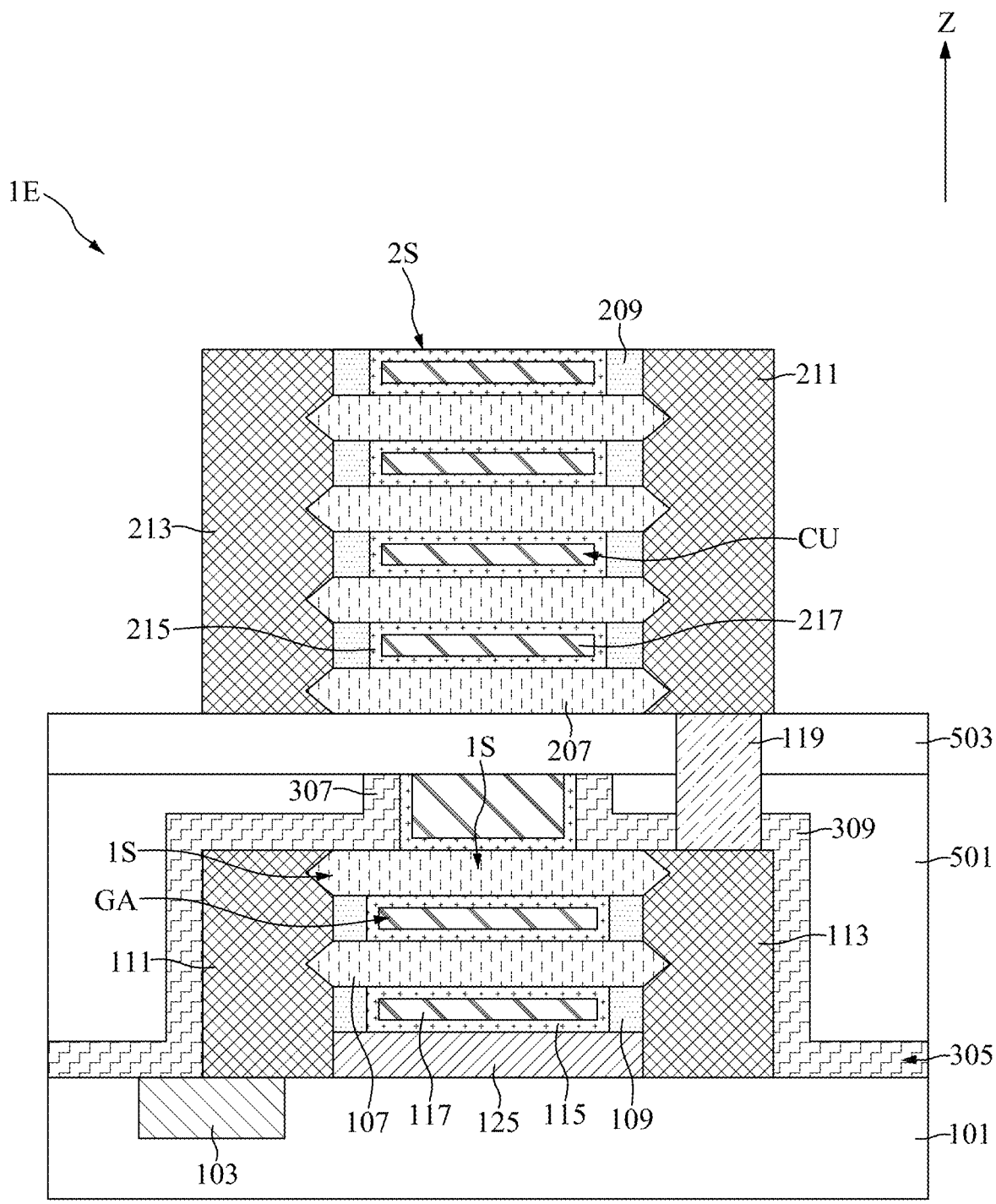

With reference to FIG. 28, the semiconductor device 1E may have a structure similar to that illustrated in FIG. 24. The same or similar elements in FIG. 28 as in FIG. 24 have been marked with similar reference numbers and duplicative descriptions have been omitted. The semiconductor device 1E may include a buffer layer 125. The buffer layer 125 may be disposed between the first stack structure 1S and the first substrate 101.

In some embodiments, the buffer layer 125 may be formed of, for example, a group IV material, such as Si, Ge, SiGe, SiGeSn, or the like; a group Ill-group V compound material, such as GaAs, GaP, GaAsP, AlInAs, AlGaAs, GaInAs, InAs, GaInP, InP, InSb, GaInAsP or the like; or the like. In some embodiments, the buffer layer 125 may include a crystalline material and may have a natural lattice constant that is mismatched to the natural lattice constant of the crystalline material of the second substrate 201. For example, the buffer layer 125 may be a layer of $Si_{0.75}Ge_{0.25}$. The thickness of the buffer layer 125 may be between about 50 nm and about 500 nm. The buffer layer 125 may be formed by metal-organic chemical vapor deposition, molecular beam epitaxy, liquid phase epitaxy, vapor phase epitaxy, ultra-high-vacuum chemical vapor deposition, the like, or a combination thereof.

Figure 29:
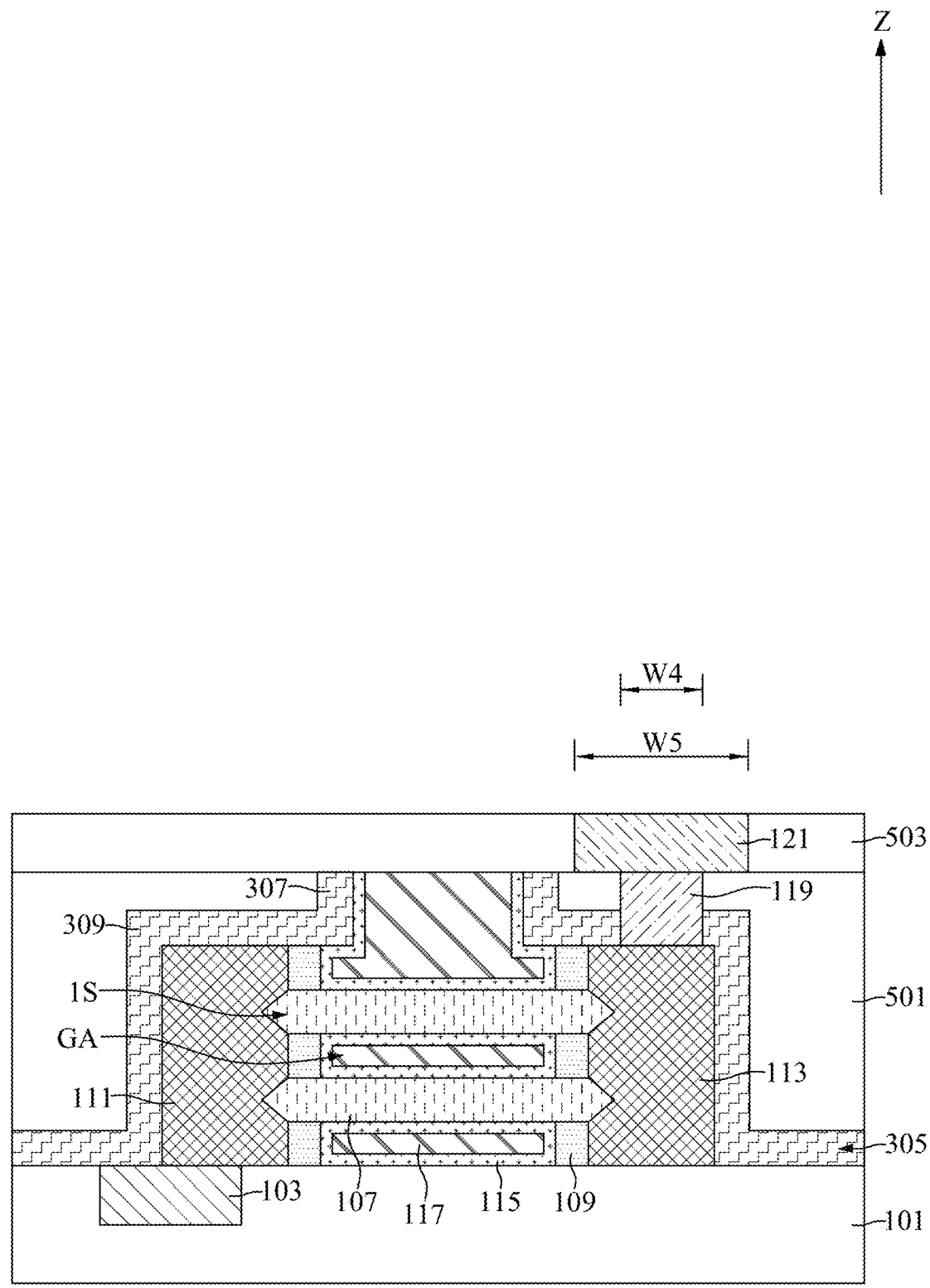
FIGS. 29 and 30 illustrate, in schematic cross-sectional view diagrams, part of a flow for fabricating a semiconductor device in accordance with another embodiment of the present disclosure.
Figure 30:
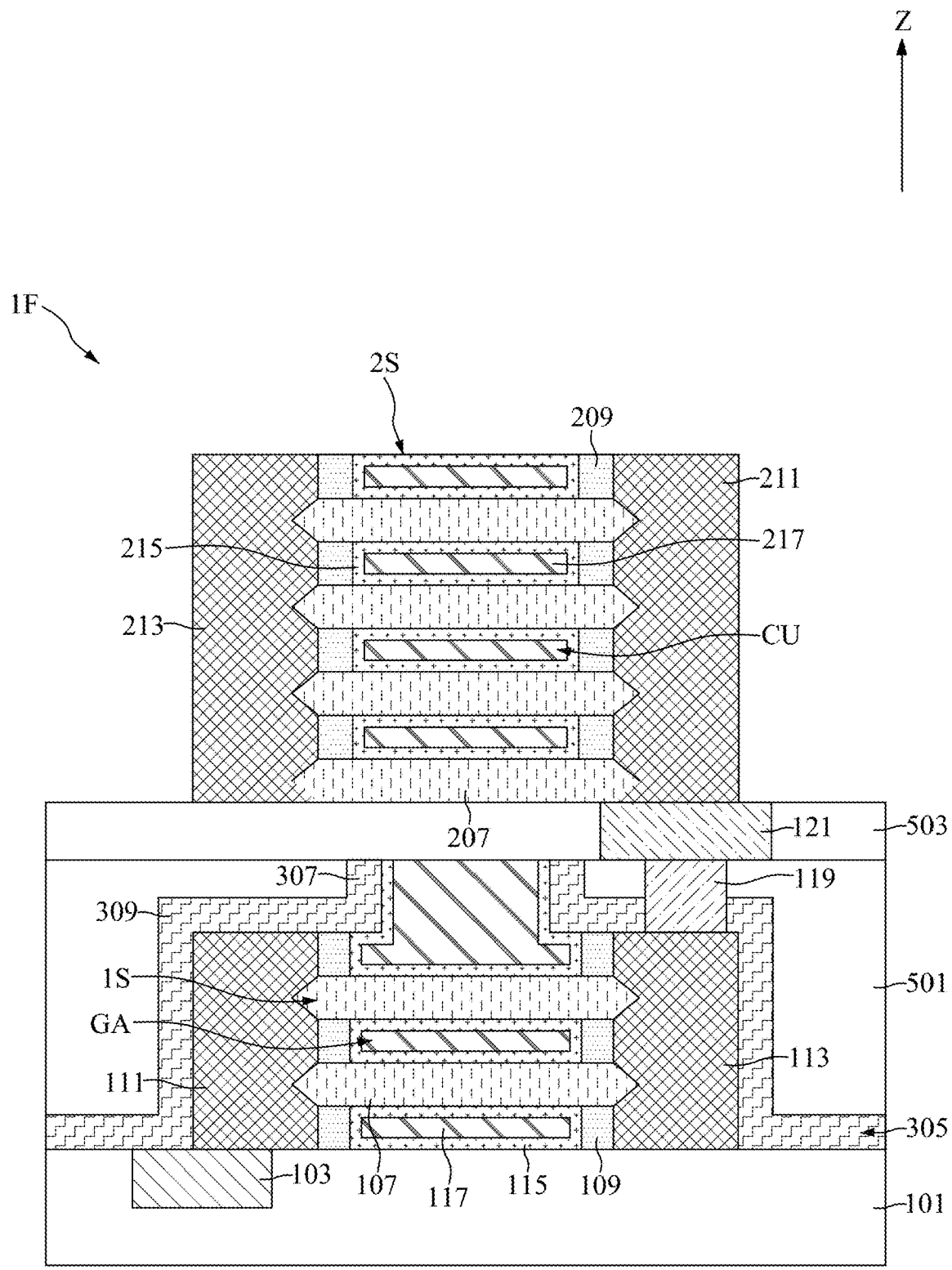

FIGS. 29 and 30 illustrate, in schematic cross-sectional view diagrams, part of a flow for fabricating a semiconductor device 1F in accordance with another embodiment of the present disclosure.

With reference to FIG. 29, an intermediate semiconductor device may be fabricating with a procedure similar to that illustrated in FIGS. 2 to 11. The first conductive plug 119 may be formed along the first insulation layer 501 and the covering portions 309 and formed on the second impurity region 113. The middle insulation layer 503 may be formed on the first insulation layer 501, the first conductive plug 119, and the first stack structure 1S. A first conductive pad 121 may be formed along the middle insulation layer 503 and on the first conductive plug 119. The width W5 of the first conductive pad 121 may be greater than the width W4 of the first conductive plug 119. The first conductive pad 121 and the first conductive plug 119 may be electrically connected.

With reference to FIG. 30, the second stack structure 2S, the third impurity region 211, and the fourth impurity region 213 may be formed with a procedure similar to that illustrated in FIGS. 13 to 24. The third impurity region 211 may be electrically connected to the first conductive pad 121. The greater width of the first conductive pad 121 may provide a larger window of aligning the third impurity region 211 and the first conductive pad 121 during the bonding procedure.

FIGS. 31 to 34 illustrate, in schematic cross-sectional view diagrams, part of a flow for fabricating a semiconductor device 1G in accordance with another embodiment of the present disclosure.

Figure 31:
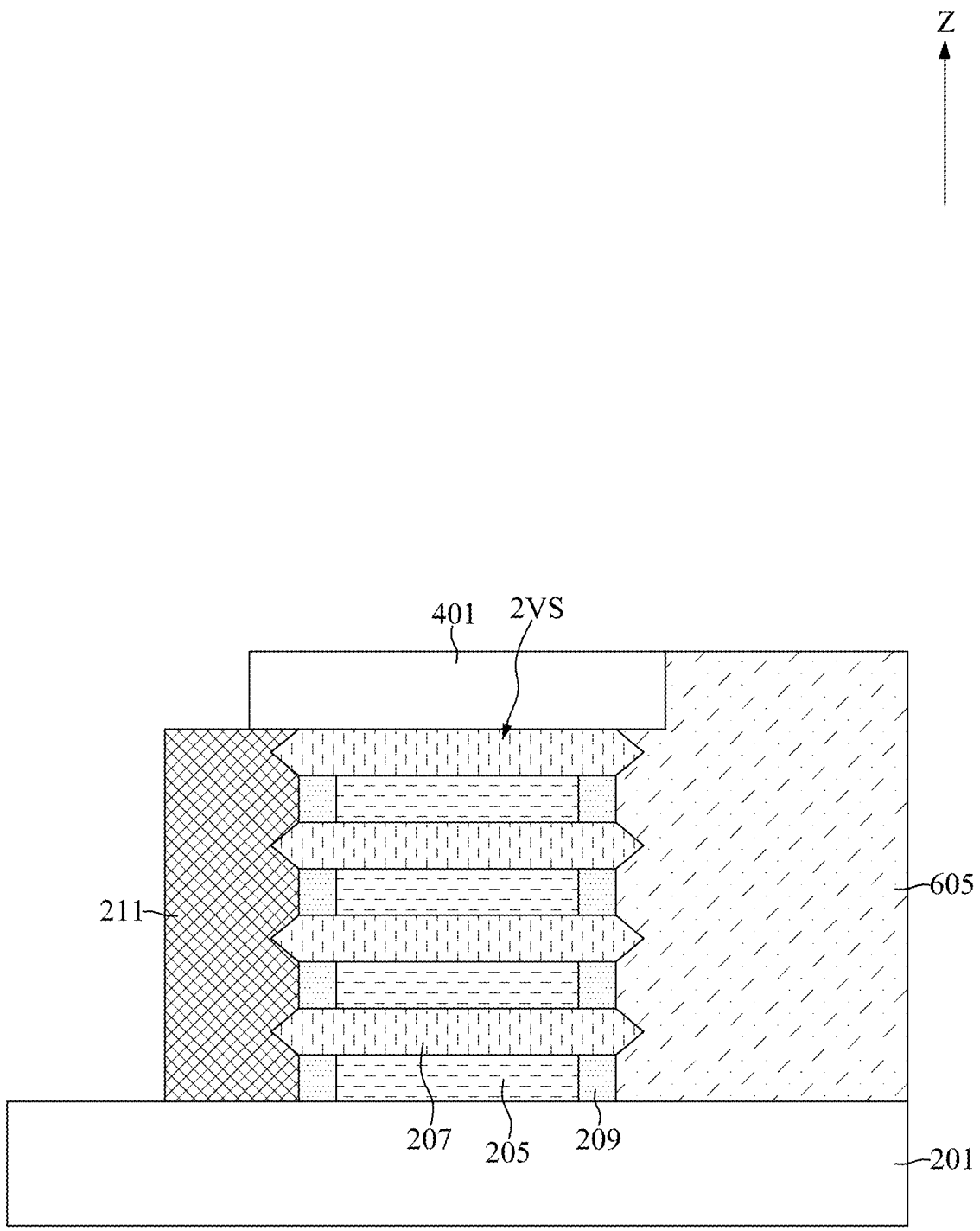
FIGS. 31 to 34 illustrate, in schematic cross-sectional view diagrams, part of a flow for fabricating a semiconductor device in accordance with another embodiment of the present disclosure.

With reference to FIG. 31, an intermediate semiconductor device may be fabricating with a procedure similar to that illustrated in FIGS. 2 to 15. A first mask layer 605 may be formed to cover one side of the second vertical stack 2VS. In some embodiments, the first mask layer 605 may be a photoresist layer. The third impurity region 211 may be formed on the other side of the second vertical stack 2VS with a procedure similar to the first impurity region 111 illustrated in FIG. 7. After the formation of the third impurity region 211, the first mask layer 605 may be removed.

Figure 32:
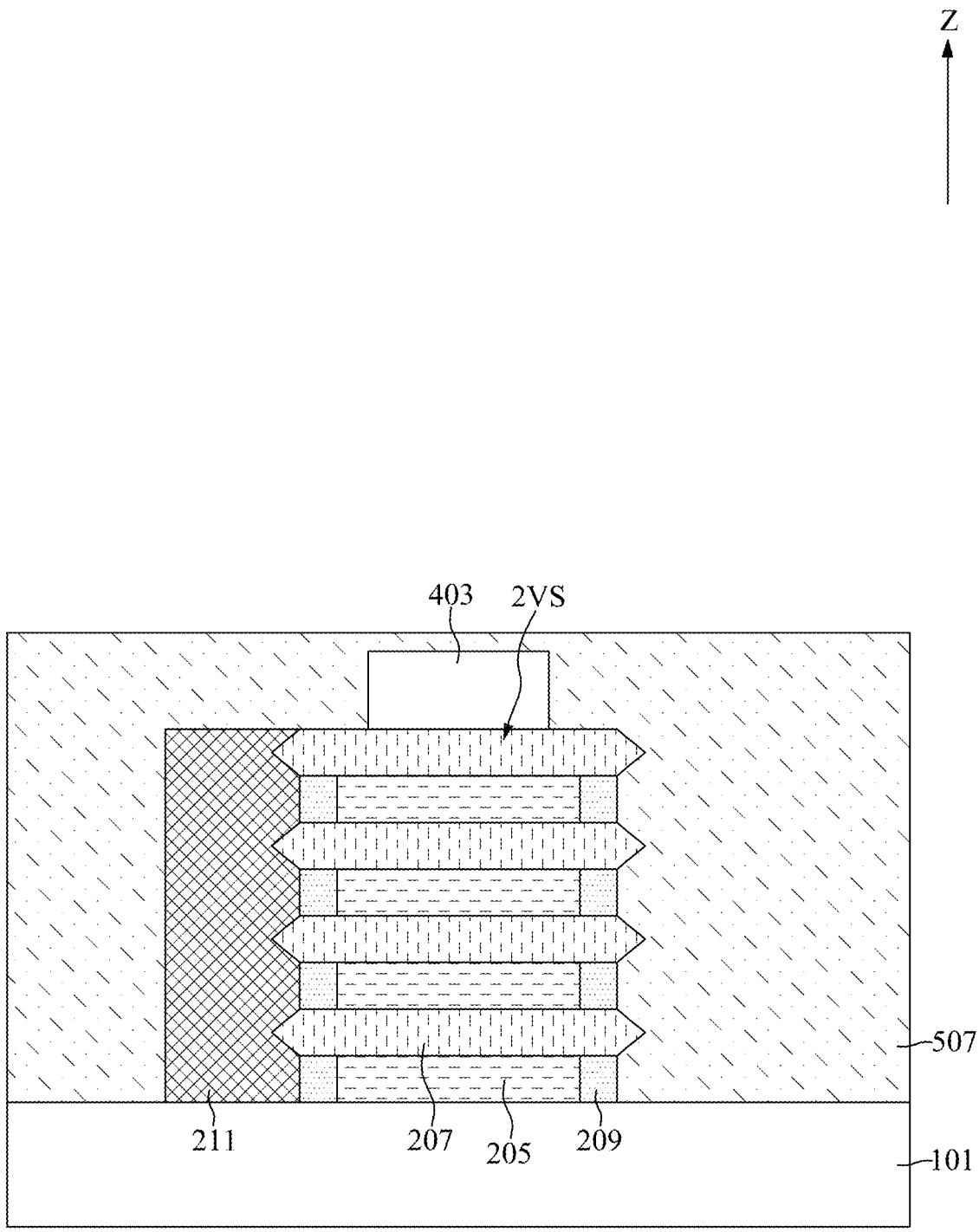

With reference to FIG. 32, the second dummy gate 401 may be trimmed to form a second reduced dummy gate 403 with a procedure similar to that illustrated in FIG. 16. The sacrificial insulation layer 507 may be formed to cover the second vertical stack 2VS, the third impurity region 211, and the second reduced dummy gate 403 with a procedure similar to that illustrated in FIG. 17.

Figure 33:
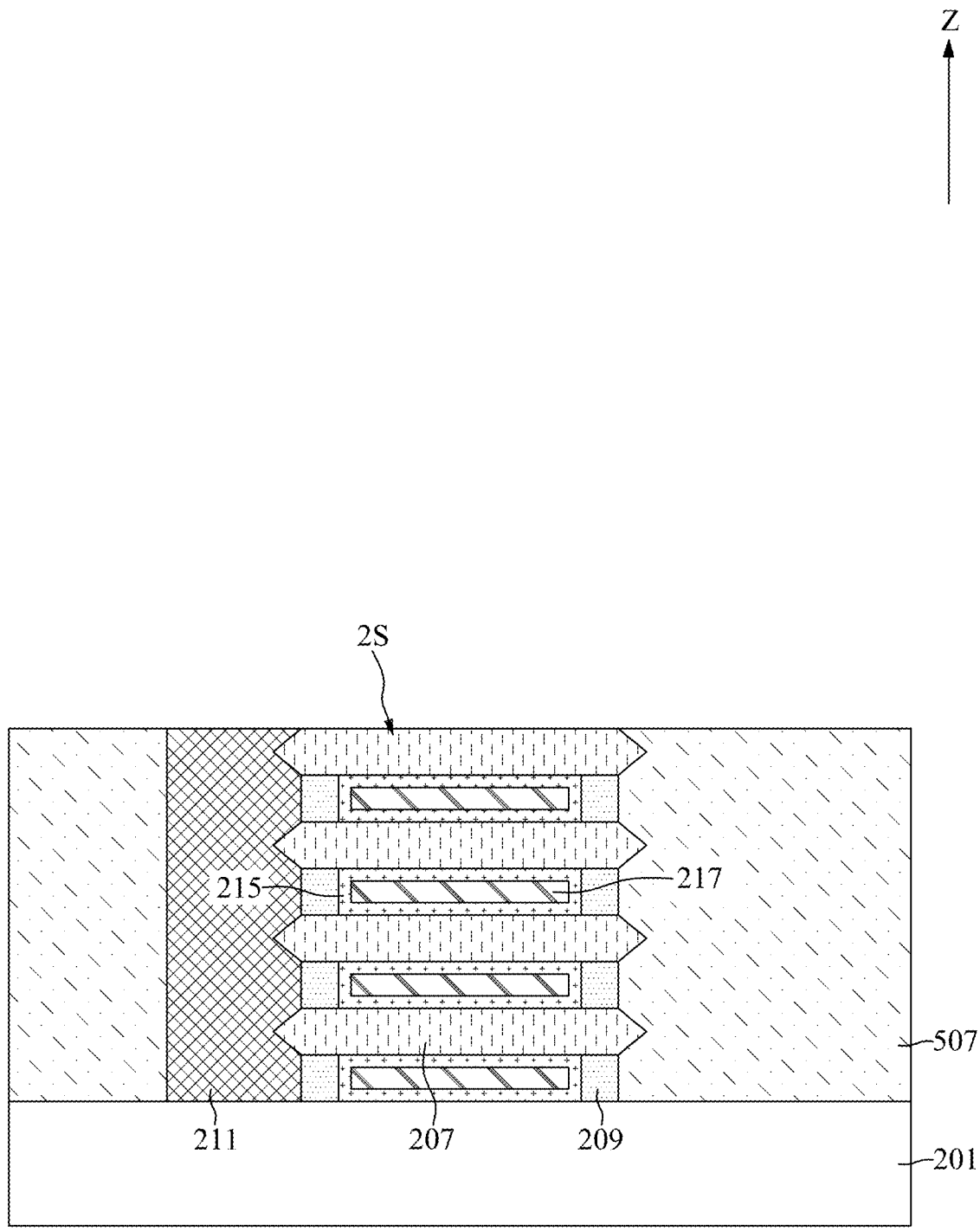

With reference to FIG. 33, a planarization process, such as chemical mechanical polishing, may be performed until the top surface of the third impurity region 211 is exposed to remove excess material, and provide a substantially flat surface for subsequent processing steps. In some embodiments, the top surface of the third impurity region 211 may be substantially coplanar with the top surface of the second stack structure 2S. In some embodiments, the top surface of the third impurity region 211 may be at a vertical level higher than a vertical level of the top surface of the second stack structure 2S.

Figure 34:
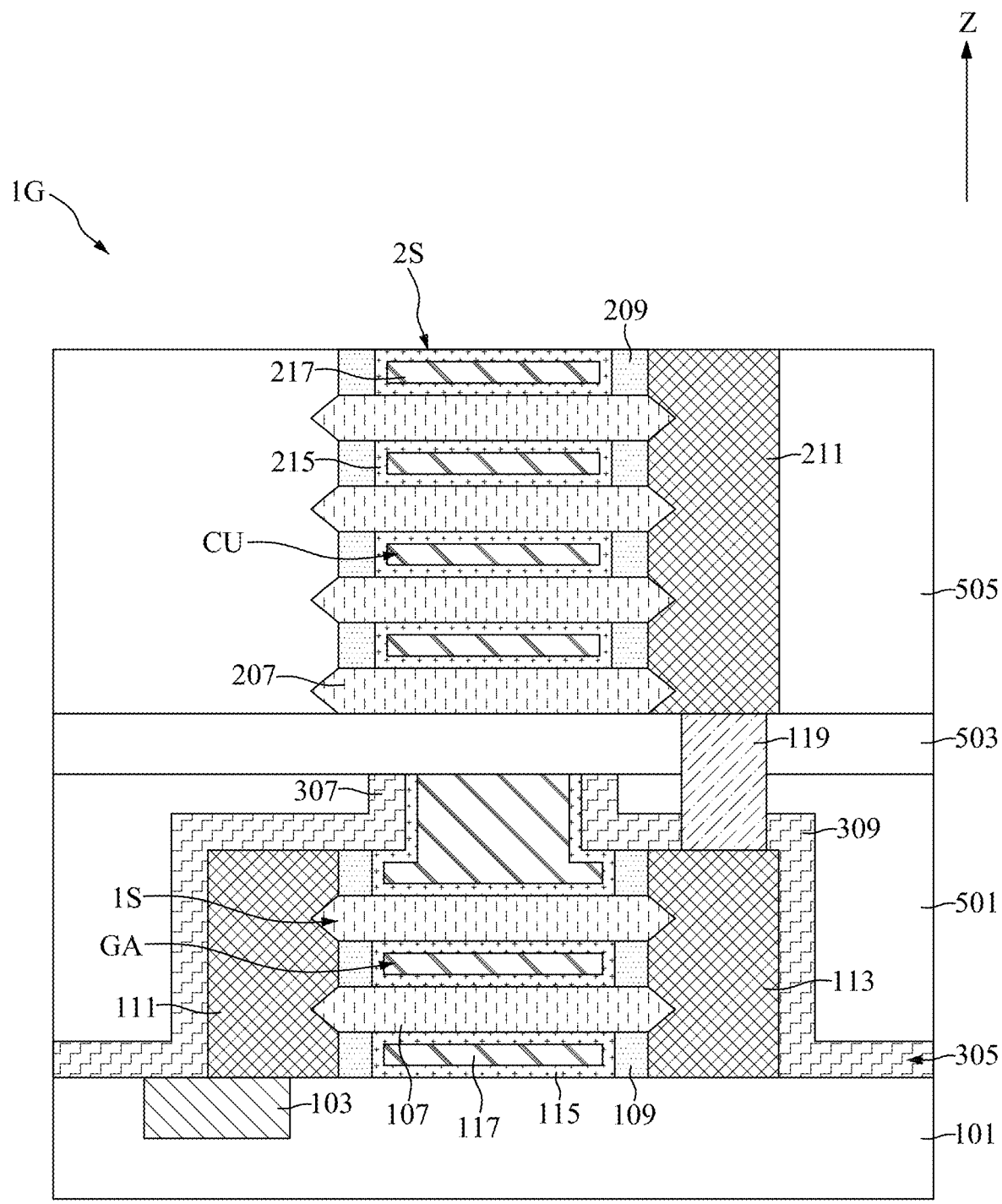

With reference to FIG. 34, the intermediate semiconductor device illustrated in FIG. 33 may be bonded onto the middle insulation layer 503 with a procedure similar to that illustrated in FIGS. 21 to 24.

Figure 35:
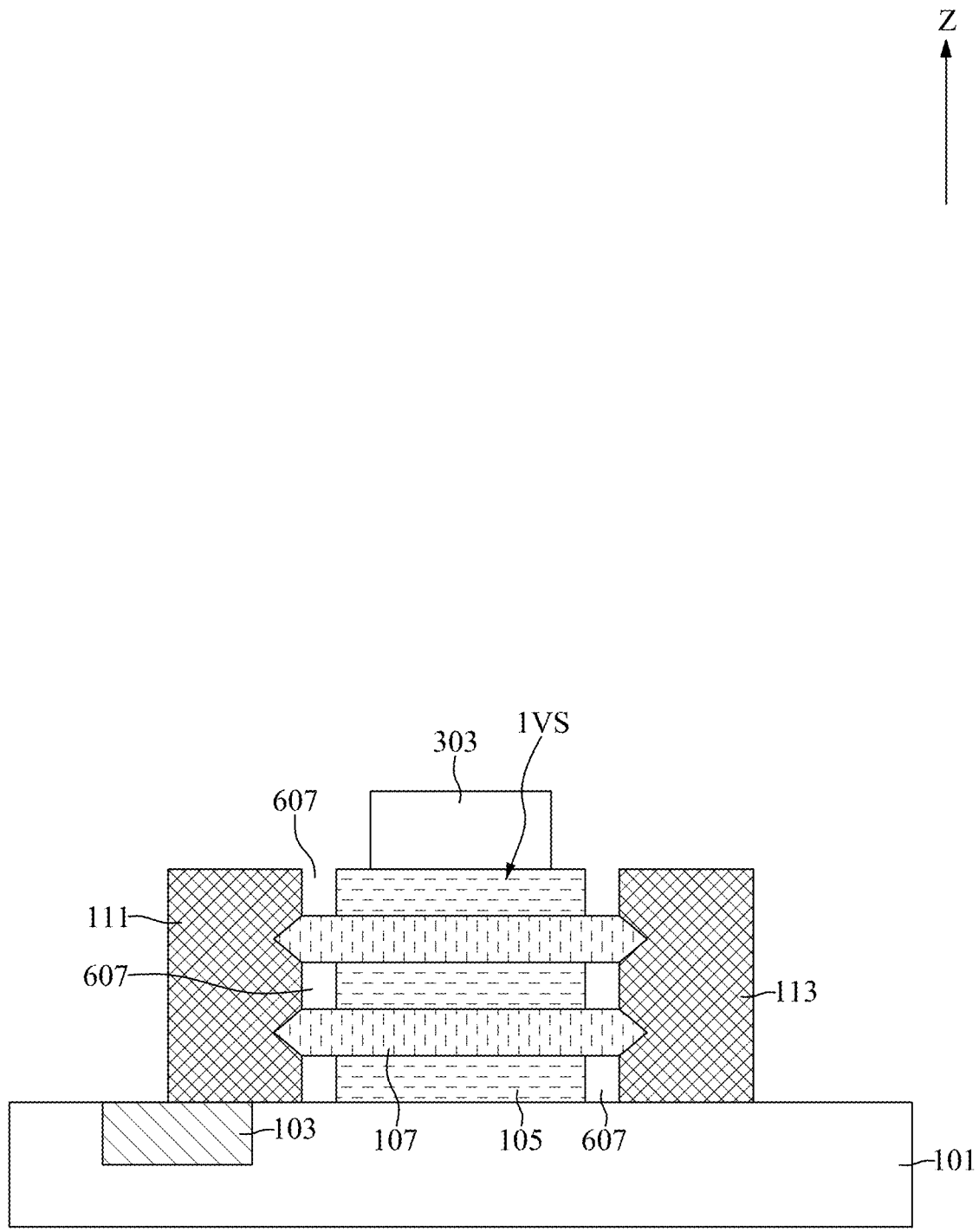
FIGS. 35 to 37 illustrate, in schematic cross-sectional view diagrams, part of a flow for fabricating a semiconductor device in accordance with another embodiment of the present disclosure.
Figure 36:
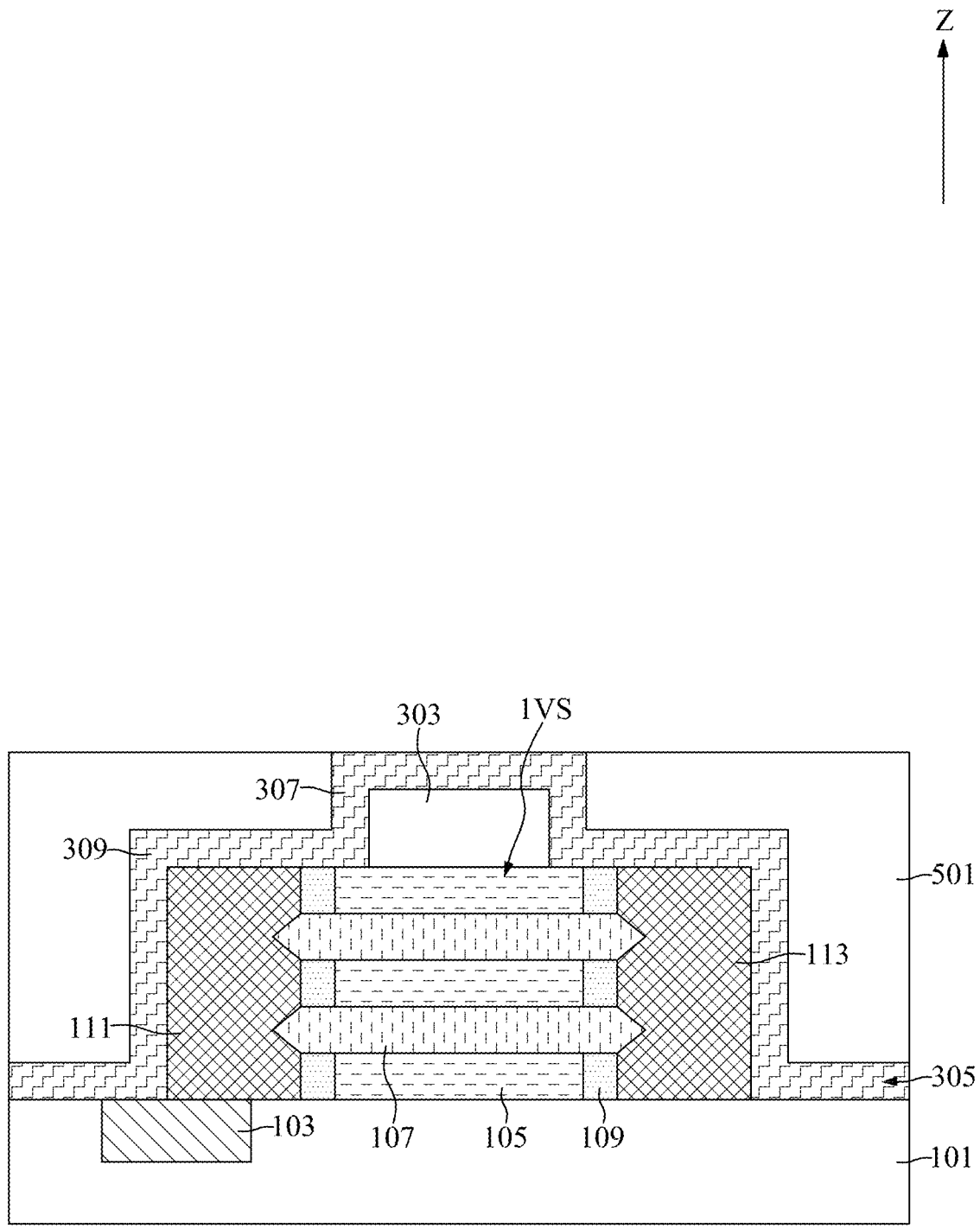
Figure 37:
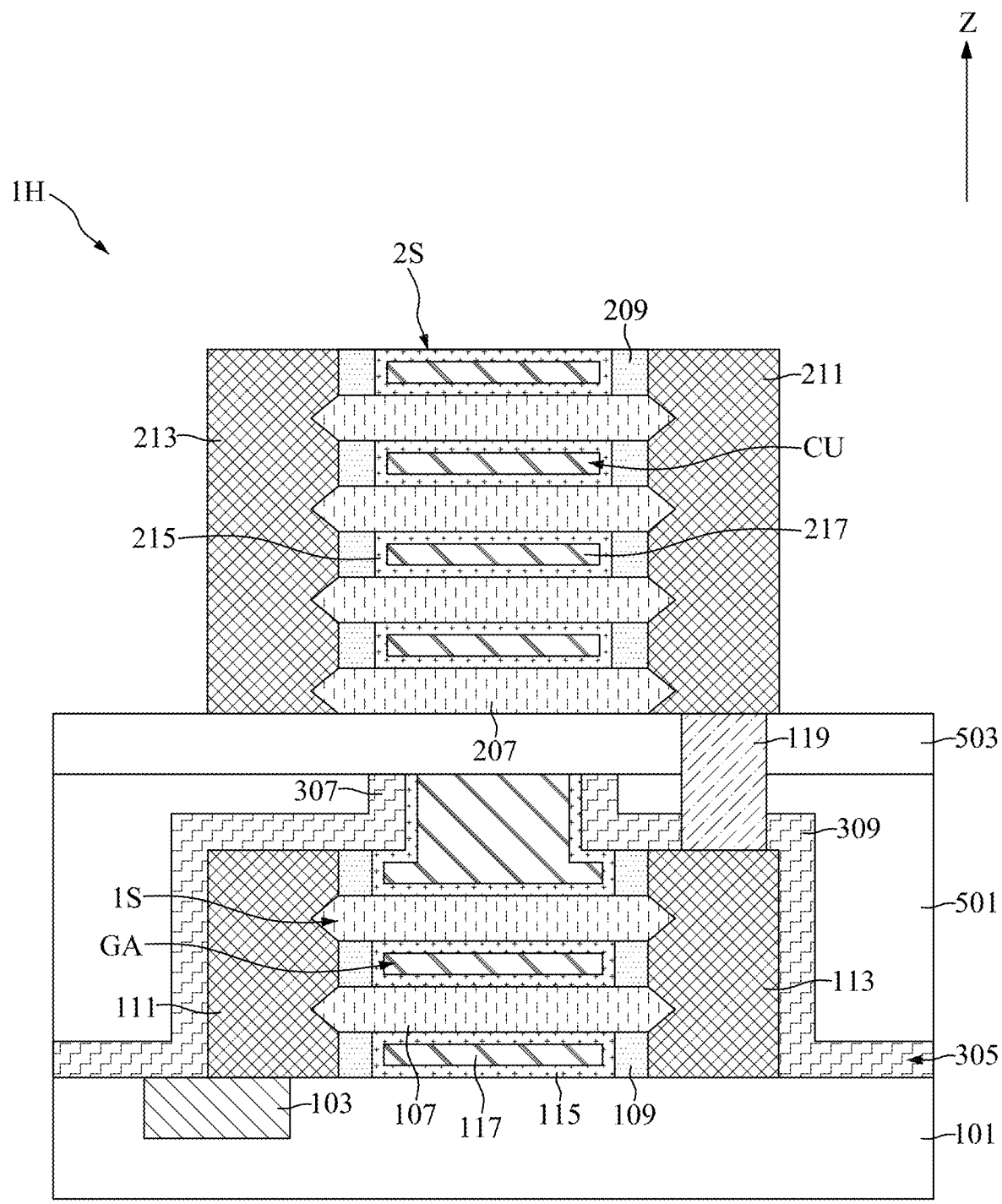

FIGS. 35 to 37 illustrate, in schematic cross-sectional view diagrams, part of a flow for fabricating a semiconductor device 1H in accordance with another embodiment of the present disclosure.

With reference to FIG. 35, an intermediate semiconductor device may be fabricating with a procedure similar to that illustrated in FIGS. 2 to 8. An oxide etch process similar to that illustrated in FIG. 6 may be performed to remove the plurality of first internal spacers 109 and form plurality of third spaces 607 at the places where the plurality of first internal spacers 109 are previous occupied.

With reference to FIG. 36, the layer of first insulation material 305 and the first insulation layer 501 may be formed with a procedure similar to that illustrated in FIG. 9. The first insulation material 305 may also fill the plurality of third spaces 607 to form the plurality of first internal spacers 109. Accordingly, the gate spacers 307 and the plurality of first internal spacers 109 are both formed of the first insulation material 305.

With reference to FIG. 37, the rest elements may be formed with a procedure similar to that illustrated in FIGS. 10 to 24.

The disclosed processes may facilitate the fabrication of semiconductor devices in the 7 nm mode and possibly beyond.

Due to the design of the semiconductor device of the present disclosure, the contact surface between the capacitor electrode 217 and the capacitor dielectric 215 may be improved. Accordingly, the capacitor configured from the capacitor dielectric 215 and the capacitor electrode 217 may have improved electrical characteristics. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a first stack structure positioned on a first substrate and comprising:
   a plurality of first semiconductor layers and a plurality of gate assemblies alternatively arranged, the plurality of gate assemblies comprising a gate dielectric and a gate electrode;
   a first impurity region and a second impurity region respectively positioned on opposing sides of the first stack structure and operatively associated with the first stack structure;
   a second stack structure positioned above the first stack structure with a middle insulation layer interposed therebetween and comprising:
   a plurality of second semiconductor layers and a plurality of capacitor sub-units alternatively arranged, the plurality of capacitor sub-units comprising a capacitor dielectric and a capacitor electrode; and
   a third impurity region positioned on one side of the second stack structure and electrically coupled to the second impurity region;
   wherein a thickness of the second stack structure is greater than a thickness of the first stack structure.

2. The semiconductor device of claim 1, further comprising a buried bit line positioned in the first substrate and electrically coupled to the first impurity region.

3. The semiconductor device of claim 2, wherein the buried bit line is horizontally distal from the first stack structure.

4. The semiconductor device of claim 3, further comprising a plurality of first internal spacers positioned between the first impurity region and the plurality of gate assemblies and between the second impurity region and the plurality of gate assemblies.

5. The semiconductor device of claim 4, further comprising gate spacers positioned on opposing sides of a topmost one of the plurality of gate assemblies.

6. The semiconductor device of claim 5, wherein the gate spacers and the plurality of first internal spacers are formed of a same material.

7. The semiconductor device of claim 5, further comprising a plurality of second internal spacers positioned between the third impurity region and the plurality of capacitor sub-units.

8. The semiconductor device of claim 5, further comprising a fourth impurity region positioned opposite to the third impurity region.

9. The semiconductor device of claim 5, wherein the second impurity region and the third impurity region are electrically connected by a first conductive plug.

10. The semiconductor device of claim 5, further comprising a first conductive pad positioned underneath the third impurity region and a first conductive plug positioned underneath the first conductive pad and on the second impurity region, wherein the second impurity region and the third impurity region are electrically coupled by the first conductive pad and the first conductive plug.

11. The semiconductor device of claim 1, wherein a lowermost one of the plurality of first semiconductor layers directly contacts a top surface of the first substrate.

12. The semiconductor device of claim 1, wherein a lowermost one of the plurality of gate assemblies directly contacts a top surface of the first substrate.

13. The semiconductor device of claim 1, further comprising a buried insulation layer positioned in the first substrate, wherein the first stack structure is positioned on the buried insulation layer.

14. The semiconductor device of claim 1, further comprising a buffer layer positioned between the first substrate and the first stack structure.

15. The semiconductor device of claim 1, wherein a lowermost one of the plurality of second semiconductor layers directly contacts a top surface of the middle insulation layer.

16. The semiconductor device of claim 1, wherein a lowermost one of the plurality of capacitor sub-units directly contacts a top surface of the middle insulation layer.

17. A method for fabricating a semiconductor device, comprising:
   forming a first stack structure on a first substrate, the first stack structure comprising:
   a plurality of first semiconductor layers and a plurality of gate assemblies alternatively arranged, the plurality of gate assemblies comprising a gate dielectric and a gate electrode;
   forming a first impurity region and a second impurity region respectively on opposing sides of the first stack structure;

forming a middle insulation layer on the first stack structure;
forming a first conductive plug along the middle insulation layer and electrically connected to the second impurity region;
forming a second stack structure on the middle insulation layer, the second stack structure comprising:
  a plurality of second semiconductor layers and a plurality of capacitor sub-units alternatively arranged, the plurality of capacitor sub-units comprising a capacitor dielectric and a capacitor electrode; and
forming a third impurity region on one side of the second stack structure and electrically connected to the first conductive plug;
wherein the step of forming the first stack structure on the first substrate comprises:
  forming a first vertical stack on the first substrate comprising alternatively forming a plurality of third semiconductor layers and the plurality of first semiconductor layers;
  forming a first dummy gate on the first vertical stack;
  forming first trenches on opposing sides of the first vertical stack to expose side portions of the plurality of first semiconductor layers and the plurality of third semiconductor layers;
  oxidizing the side portions of the plurality of first semiconductor layers and the plurality of third semiconductor layers to form first side-portion oxides on opposing sides of the plurality of first semiconductor layers and third side-portion oxides on opposing sides of the plurality of third semiconductor layers;
  removing the first side-portion oxides;
  forming a first impurity region and a second impurity region in the first trenches;
  forming a layer of first insulation material to cover the first dummy gate, the first impurity region, the second impurity region, and the first vertical stack;
  removing a portion of the layer of first insulation material to expose the first dummy gate;
  removing the first dummy gate and the plurality of third semiconductor layers to form a plurality of first spaces; and
  sequentially forming the gate dielectric and the gate electrode to fill the plurality of first spaces, the gate dielectric and gate electrode together configure the plurality of gate assemblies, and the plurality of first semiconductor layers and the plurality of gate assemblies together configure the first stack structure
wherein the step of forming the second stack structure on the middle insulation layer comprises:
  forming a second vertical stack on a second substrate comprising alternatively forming a plurality of fourth semiconductor layers and the plurality of second semiconductor layers;
  forming a second dummy gate on the second vertical stack;
  forming second trenches on opposing sides of the second vertical stack to expose side portions of the plurality of second semiconductor layers and the plurality of fourth semiconductor layers;
  oxidizing the side portions of the plurality of second semiconductor layers and the plurality of fourth semiconductor layers to form second side-portion oxides on opposing sides of the plurality of second semiconductor layers and fourth side-portion oxides on opposing sides of the plurality of fourth semiconductor layers;
  removing the second side-portion oxides;
  removing the second dummy gate and the plurality of fourth semiconductor layers to form a plurality of second spaces;
  sequentially forming the capacitor dielectric and the capacitor electrode to fill the plurality of second spaces, the capacitor dielectric and capacitor electrode together configure the plurality of capacitor sub-units, the plurality of second semiconductor layers and the plurality of capacitor sub-units together configure the second stack structure;
  inversely bonding the second stack structure onto the middle insulation layer; and
  removing the second substrate.

\* \* \* \* \*